(12) United States Patent
Maeda et al.

(10) Patent No.: US 6,465,832 B1
(45) Date of Patent: Oct. 15, 2002

(54) SEMICONDUCTOR DEVICE

(75) Inventors: Shigenobu Maeda; Kazuya Yamamoto, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/543,544

(22) Filed: Apr. 5, 2000

(30) Foreign Application Priority Data

Oct. 27, 1999 (JP) .......................................... 11-305262

(51) Int. Cl.$^7$ .......................... H01G 4/30; H01L 29/00
(52) U.S. Cl. ..................... 257/307; 257/308; 257/312; 257/532
(58) Field of Search ................. 257/307, 308, 257/595, 312, 758, 602, 759, 760, 68, 71, 296, 298, 300, 301, 313, 516, 532, 535, 906, 908; 361/303, 306.1

(56) References Cited

U.S. PATENT DOCUMENTS

| | | | | |
|---|---|---|---|---|
| 4,419,310 A | * | 12/1983 | Burn et al. .................... | 264/59 |
| 5,583,359 A | * | 12/1996 | Ng et al. ..................... | 257/306 |
| 5,731,609 A | * | 3/1998 | Hamamoto et al. .......... | 257/302 |
| 6,028,324 A | * | 2/2000 | Su et al. ...................... | 257/48 |
| 6,088,258 A | * | 7/2000 | Aitken et al. ................ | 365/149 |
| 6,144,053 A | * | 11/2000 | Tsunemine ................... | 257/295 |
| 6,166,440 A | * | 12/2000 | Yang ........................... | 257/758 |
| 6,297,524 B1 | * | 10/2001 | Vathulya et al. ............. | 257/303 |

FOREIGN PATENT DOCUMENTS

| | | | |
|---|---|---|---|
| JP | 7-130876 | | 5/1995 |
| JP | 08298320 A | * | 11/1996 |

\* cited by examiner

*Primary Examiner*—Nathan J. Flynn
*Assistant Examiner*—Johannes P Mondt
(74) *Attorney, Agent, or Firm*—Oblon, Spivak, McClelland, Maier & Neustadt, P.C.

(57) ABSTRACT

A small-sized low-power-loss capacitor having low parasitic resistance is obtained by adopting metal wires as wires in a line and space structure to utilize capacitances between adjacent metal wires. A plurality of wires (3) each extending in a direction (x) and composed of metals such as Al and Cu are aligned in a direction (y) at predetermined intervals, forming a line and space structure (4). The line and space structure (4) is formed on a silicon substrate (1). On the silicon substrate (1), an insulation film (2) composed for example of a silicon oxide film is formed to provide electrical isolation between adjacent wires (3).

19 Claims, 26 Drawing Sheets

F I G . 1
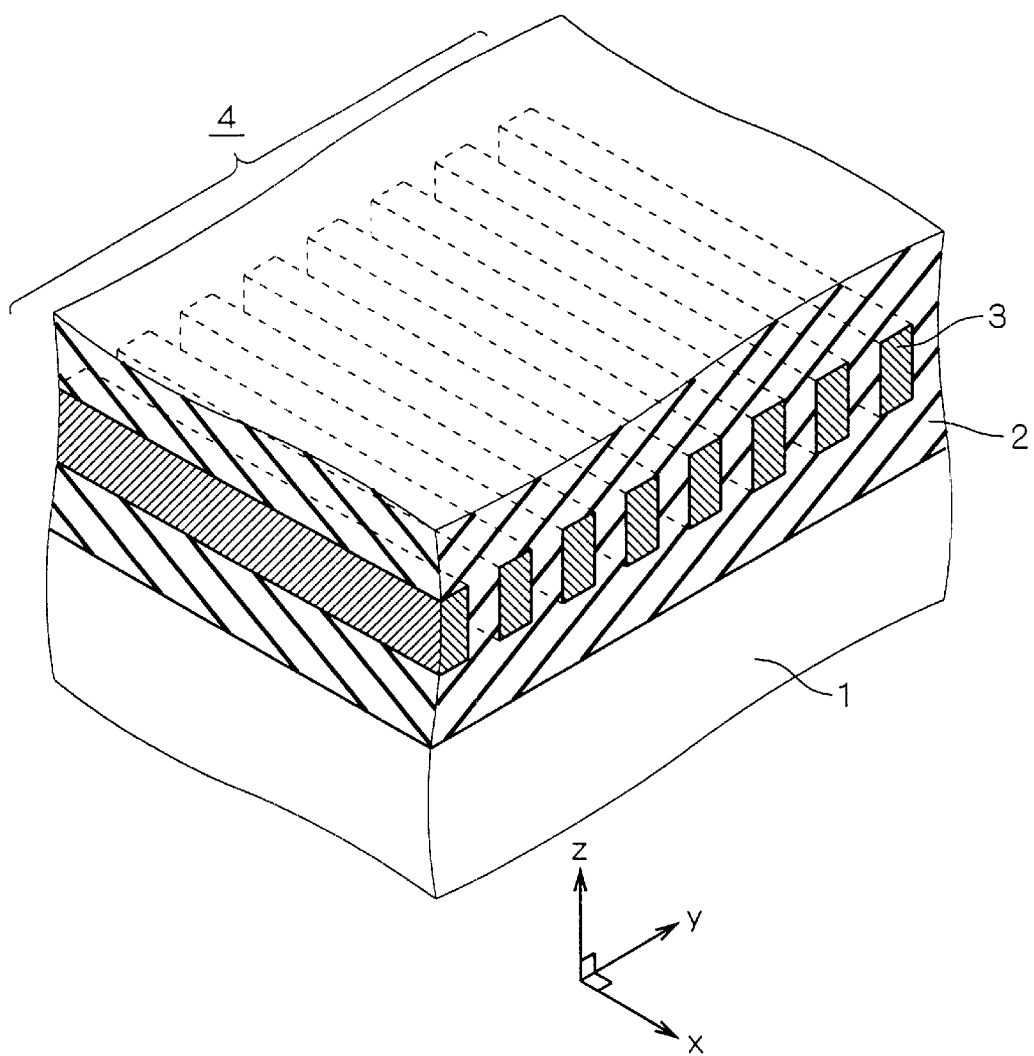

F I G . 4
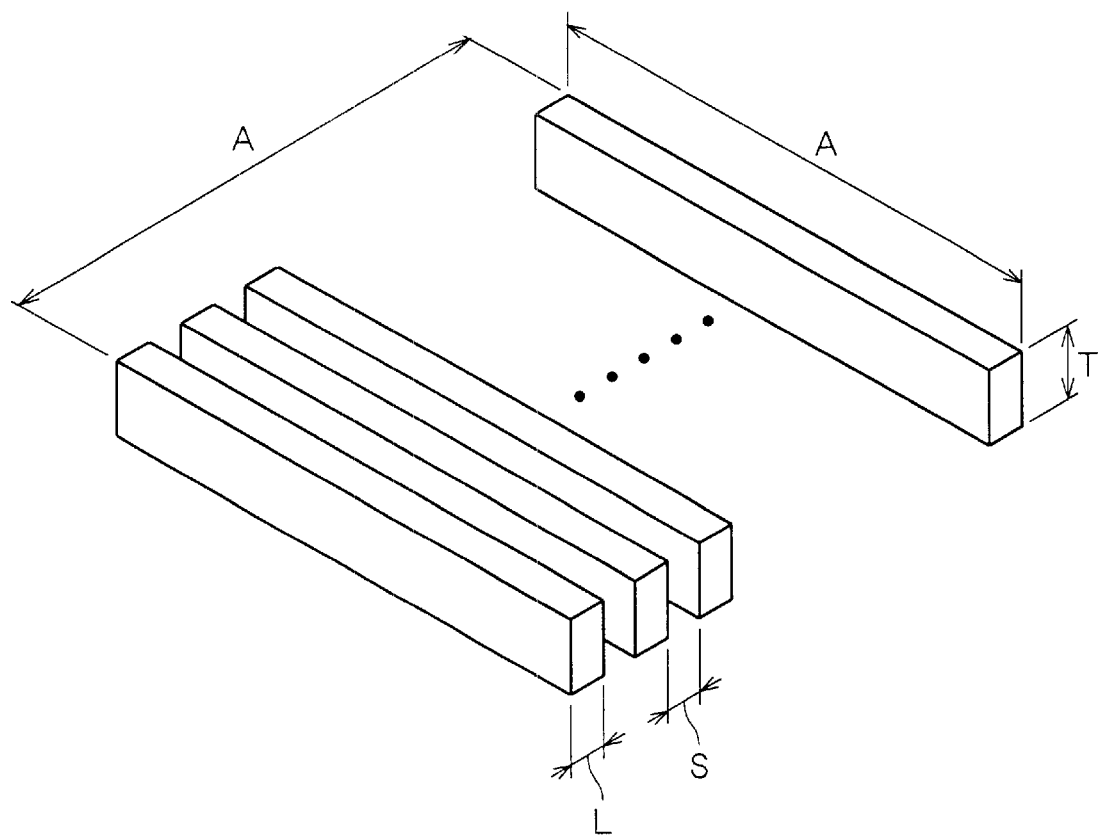

F I G . 18
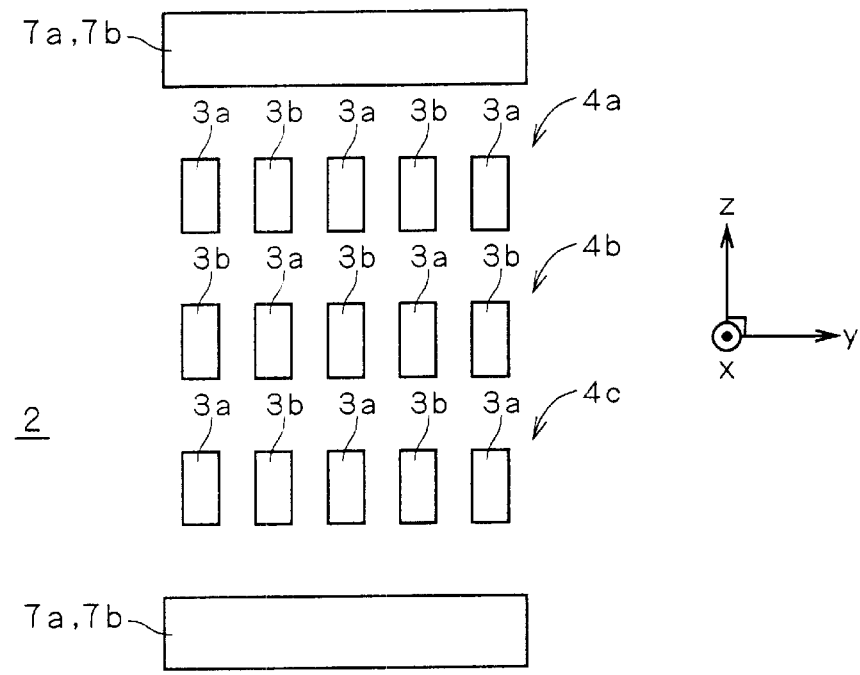
F I G . 19
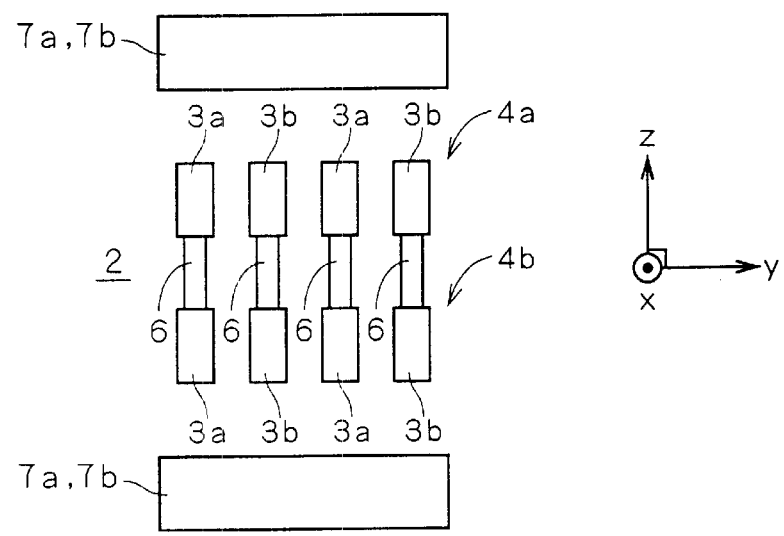

F I G . 2 2
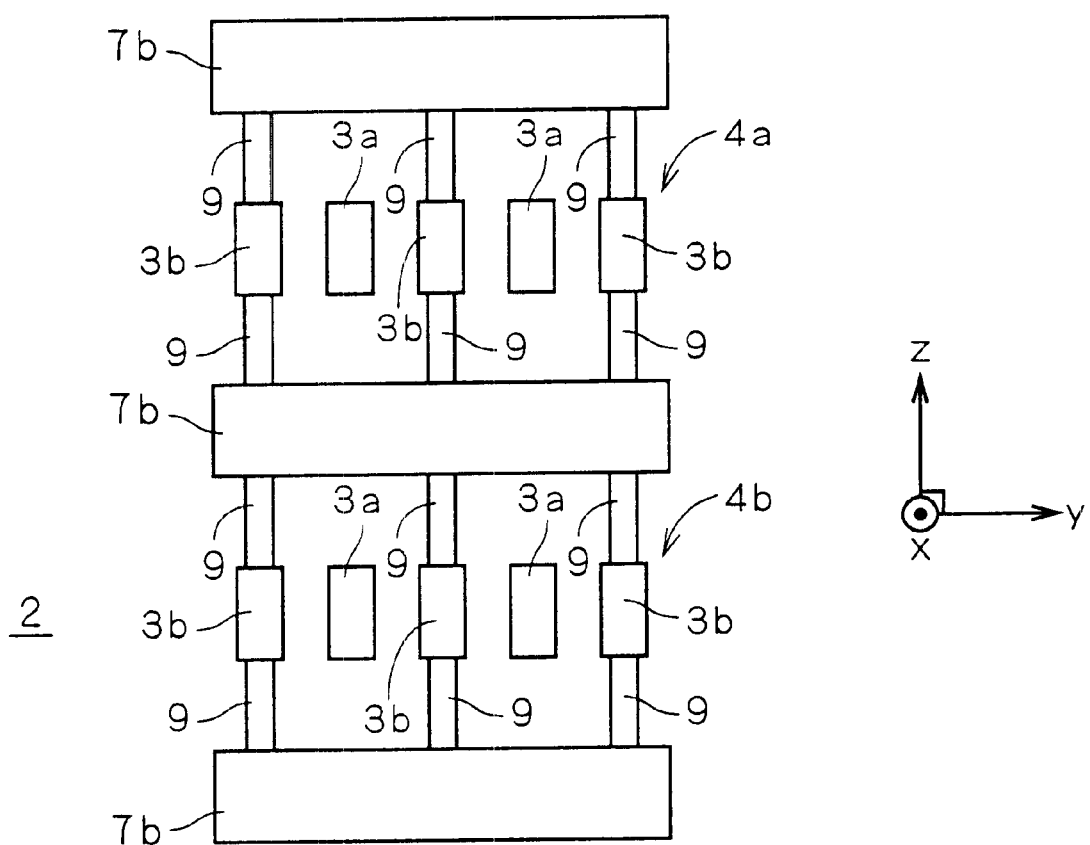

F I G. 26
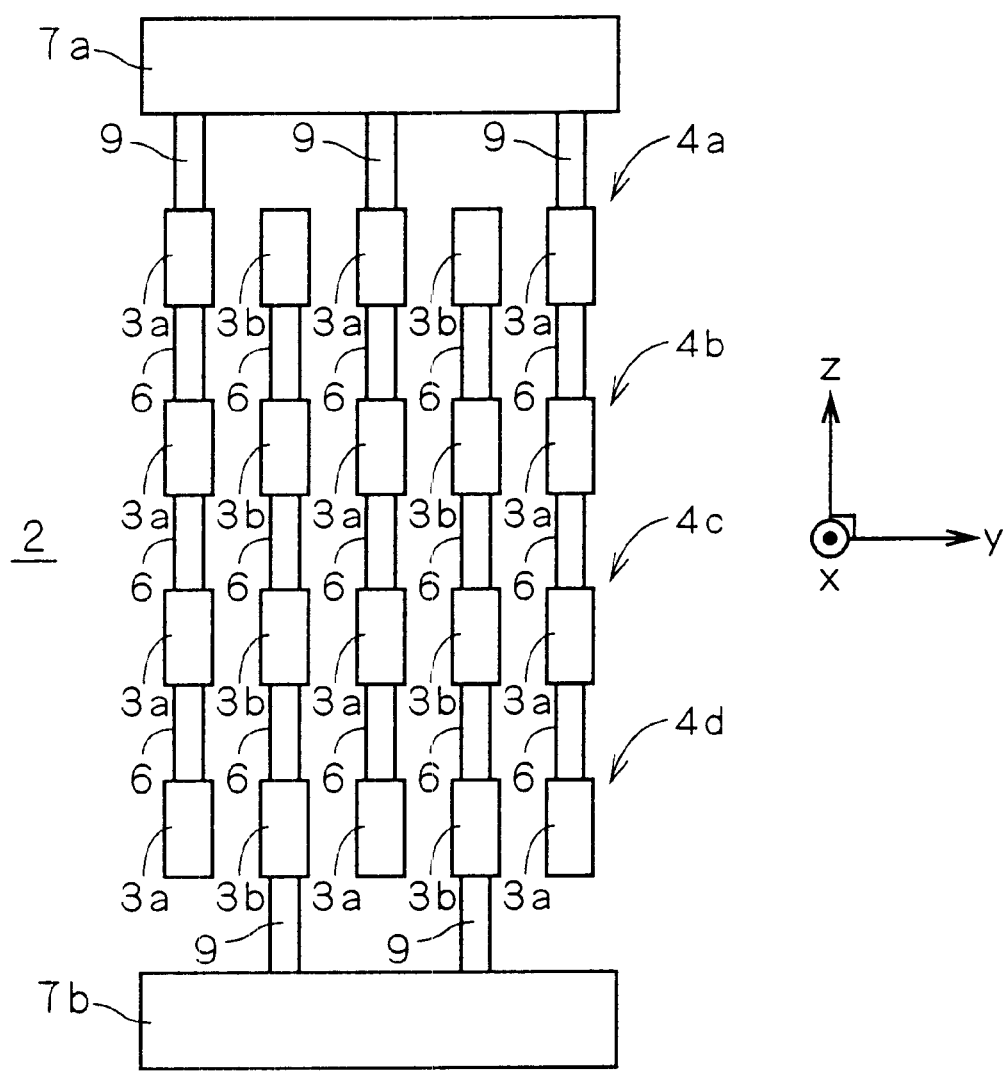

F I G . 2 7
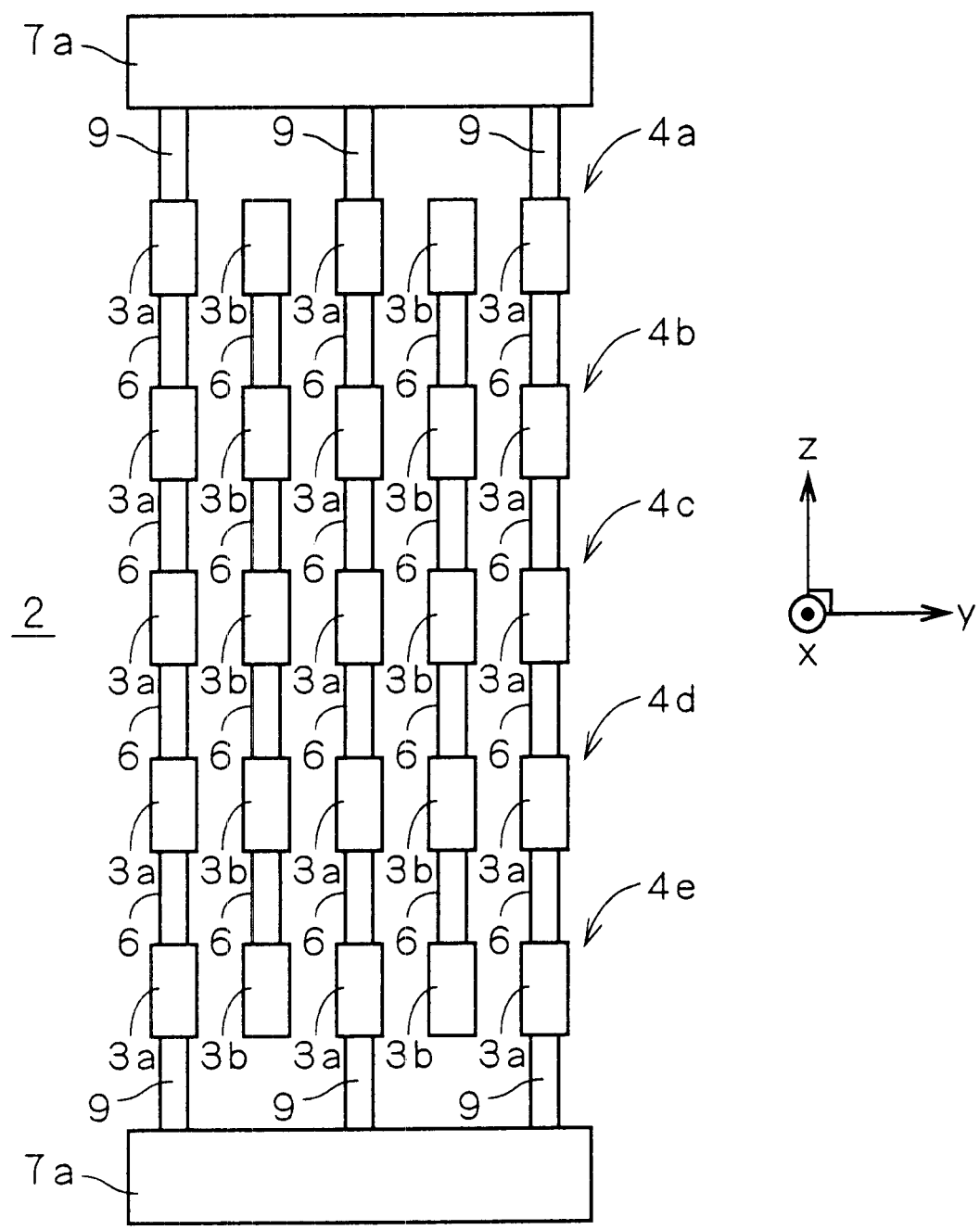

F I G . 2 8
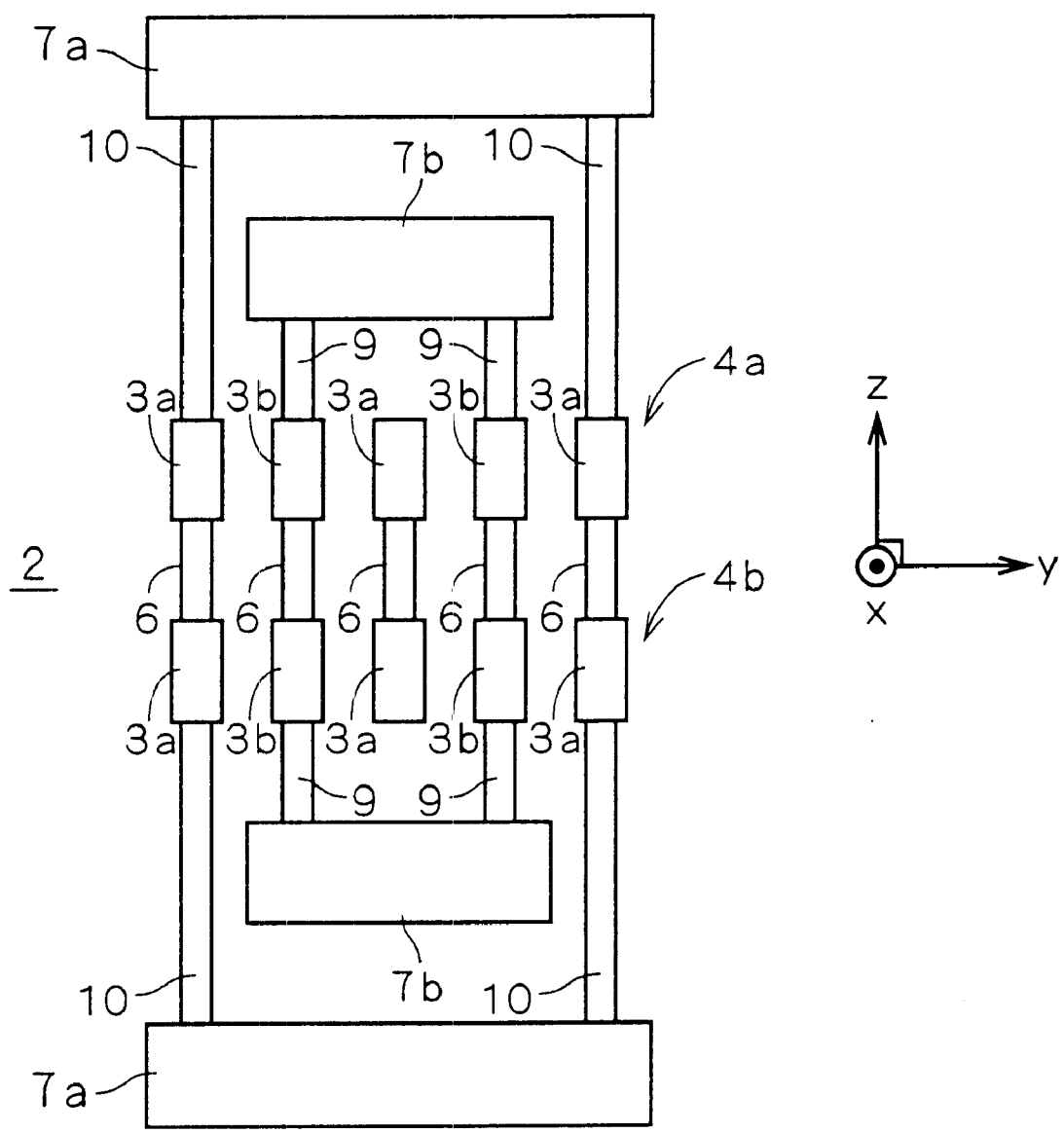

SEMICONDUCTOR DEVICE

BACKGROUND OF THE INVENTION

1. Field of the Invention

The present invention relates to a semiconductor device, especially, the structure of a semiconductor device comprising a capacitor.

2. Description of the Background Art

FIG. 39 is a cross-sectional view showing the structure of a conventional capacitor used in LSI. On a semiconductor substrate 101, there is formed an insulation film 120 on which an insulation film 103 and a capacitor comprising a pair of polysilicon films 102, 104 sandwiching the insulation film 103 are formed. An interlayer insulation film 105 is formed on the capacitor, and metal wires 106, 107 are selectively formed on the interlayer insulation film 105. The metal wires 106, 107 are electrically connected to the polysilicon films 102, 104 through contact holes 108, 109 formed in the interlayer insulation film 105, respectively.

FIG. 40 is a cross-sectional view showing the structure of another conventional capacitor. An interlayer insulation film 112 and a capacitor comprising metal wires 110, 111 facing across the interlayer insulation film 112 are formed on the insulation film 120.

In the conventional capacitor in FIG. 39, the polysilicon films 102 and 104 have high parasitic resistance, so its equivalent circuit is as shown in FIG. 41. High power losses due to parasitic resistance R101, R102 make the capacitor useless for an analog circuit.

In the capacitor in FIG. 40, on the other hand, the use of the metal wires 110, 111 allows the capacitor to have low parasitic resistance and low power losses. However, since the interlayer insulation film 112 is thick (about 1 μm for a device using 0.2-μm design rules), a large area is necessary to obtain a high-capacitance capacitor.

SUMMARY OF THE INVENTION

A first aspect of the present invention is directed to a semiconductor device comprising: an underlying layer having a main surface; and a capacitor formed on the main surface of the underlying layer. The capacitor has at least one line and space structure in which a plurality of metal wires each extending in a first direction of the main surface are electrically isolated from each other by an insulation film and aligned in a second direction of the main surface perpendicular to the first direction.

According to a second aspect of the present invention, in the semiconductor device of the first aspect, the line and space structure includes a first wire serving as one electrode and a second wire serving as the other electrode, the first wire and the second wire being aligned alternately.

According to a third aspect of the present invention, in the semiconductor device of the second aspect, the capacitor further includes at least one flat electrode which is parallel to the main surface and aligned with the line and space structure in a third direction perpendicular to the main surface through a predetermined interlayer insulation film.

According to a fourth aspect of the present invention, in the semiconductor device of the second aspect, the at least one line and space structure includes three or more line and space structures. The three or more line and space structures are stacked in layers with an interlayer insulation film interposed therebetween so that the first wire and the second wire in different ones of the line and space structures are aligned alternately in a third direction perpendicular to the main surface.

According to a fifth aspect of the present invention, in the semiconductor device of the fourth aspect, the capacitor further includes at least one flat electrode which is parallel to the main surface and aligned with the line and space structures in the third direction through a predetermined interlayer insulation film.

According to a sixth aspect of the present invention, in the semiconductor device of the second aspect, the at least one line and space structure includes a plurality of line and space structures. The plurality of line and space structures are stacked in layers with an interlayer insulation film interposed therebetween so that the first wires in different ones of the line and space structures are aligned and the second wires in different ones of the line and space structures are aligned, in a third direction perpendicular to the main surface. The first wires and the second wires aligned in the third direction are electrically connected to each other by through holes which are filled with conductors and formed in the interlayer insulation film.

According to a seventh aspect of the present invention, in the semiconductor device of the sixth aspect, the capacitor further includes at least one flat electrode which is parallel to the main surface and aligned with the line and space structures in the third direction through a predetermined interlayer insulation film.

According to an eighth aspect of the present invention, in the semiconductor device of either of the three, fifth, and seventh aspects, the at least one flat electrode includes a plurality of flat electrodes which are arranged on both sides of the line and space structures in alignment with the line and space structures in the third direction.

According to a ninth aspect of the present invention, in the semiconductor device of either of the three, fifth, seventh, and eighth aspects, the capacitor further includes a through hole which is filled with a conductor and formed in the predetermined interlayer insulation film to provide an electrical connection between the first wire and the flat electrode.

According to a tenth aspect of the present invention, in the semiconductor device of the seventh aspect, the capacitor further includes: a first through hole which is filled with a conductor and formed in the predetermined interlayer insulation film to provide an electrical connection between the first wire and the flat electrode; another flat electrode which is arranged outside the flat electrode through another interlayer insulation film in alignment with the line and space structures in the third direction on the same side as the flat electrode; and a second through hole which is filled with a conductor and formed in the another interlayer insulation film to provide an electrical connection between the second wire and the another flat electrode.

According to an eleventh aspect of the present invention, in the semiconductor device of the first aspect, the capacitor further includes: an interlayer insulation film formed on the line and space structure; and a highly dielectric film which is formed in contact part between the interlayer insulation film and the line and space structure and has a higher dielectric constant than a silicon oxide film.

According to a twelfth aspect of the present invention, in the semiconductor device of the first aspect, the insulation film is a highly dielectric film which has a higher dielectric constant than a silicon oxide film.

According to a thirteenth aspect of the present invention, in the semiconductor device of either of the eleventh and twelfth aspects, the semiconductor device has a wiring portion in which desired wires are formed and a capacitor portion in which the capacitor is formed; and the highly dielectric film is provided only in the capacitor portion.

According to a fourteenth aspect of the present invention, in the semiconductor device of either of the eleventh and twelfth aspects, the semiconductor device has a wiring portion in which desired wires are formed and a capacitor portion in which the capacitor is formed; and the insulation film in the wiring portion is a silicon oxide film doped with impurities for reducing the dielectric constant.

According to a fifteenth aspect of the present invention, in the semiconductor device of either of the first to fourteenth aspects, both line and space widths of the line and space structure are not more than 0.2 μm.

The semiconductor device of the first aspect adopts metal wires of low resistance as the wires in the line and space structure and utilizes capacitances between adjacent metal wires to form a capacitor. Accordingly, a small-sized high-capacitance capacitor with low parasitic resistance and low power losses can be obtained.

In the semiconductor device of the second aspect, the first wire and the second wire are aligned alternately. This simplifies the formation of a high-capacitance capacitor.

The semiconductor device of the third aspect forms capacitances between the first or second wire and the flat electrode. This allows a further increase in capacity.

Further, low power loss allows the formation of a desirable capacitor with no parasitic components, and the presence of the flat electrode reduces interference between the first or second wire and other signal lines.

In the semiconductor device of the fourth aspect, the first and second wires form capacitances between adjacent four of the second and first wires which are aligned in the second and third directions. This allows a further increase in capacity.

The semiconductor device of the fifth aspect forms capacitances between the first or second wire and the flat electrode. This allows a further increase in capacity.

Further, low power loss allows the formation of a desirable capacitor with no parasitic components, and the presence of the flat electrode reduces interference between the first or second wire and other signal lines.

The semiconductor device of the sixth aspect forms capacitances between adjacent through holes sandwiching the interlayer insulation film. This allows a further increase in capacity.

The semiconductor device of the seventh aspect forms capacitances between the first or second wire and the flat electrode. This allows a further increase in capacity.

Further, low power loss allows the formation of a desirable capacitor with no parasitic components, and the presence of the flat electrode reduces interference between the first or second wire and other signal lines.

In the semiconductor device of the eighth aspect, a plurality of flat electrodes are provided on both sides of the line and space structure. This enhances the effects of the third, fifth, and seventh aspects.

In the semiconductor device of the ninth aspect, the second wire is surrounded by the first wire, the flat electrode, and the through hole which provides an electrical connection between the first wire and the flat electrode. This effectively reduces interference between the second wire and other signal lines.

Further, the capacitance formed between the second wire and the through hole which provides an electrical connection between the first wire and the flat electrode allows a further increase in capacity.

In the semiconductor device of the tenth aspect, the first wire, the flat electrode, the first through hole, and the through hole which provides an electrical connection between the first wires are surrounded by the second wire, another flat electrode, the second through hole, and the through hole which provides an electrical connection between the second wires. This effectively reduces interference between the first wire and other signal lines.

The semiconductor device of the eleventh aspect allows an increase in capacity as compared with the case where the insulation film is composed only of a silicon oxide film.

The semiconductor device of the twelfth aspect allows an increase in capacity as compared with the case where the insulation film is composed only of a silicon oxide film.

The semiconductor device of the thirteenth aspect achieves an increase in capacity in the capacitor portion and low parasitic capacitance and high-speed operation in the wiring portion.

The semiconductor device of the fourteenth aspect reduces parasitic capacitance in the wiring portion, thus achieving high-speed operation.

The semiconductor device of the fifteenth aspect allows an increase of about one order of magnitude in capacity per unit area as compared to the case where the capacitor is composed of flat electrodes.

An object of the present invention is to provide a small-sized low-power-loss capacitor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view showing the structure of a capacitor according to a first preferred embodiment of the present invention.

FIG. 4 is a perspective view schematically showing a line and space structure.

FIGS. 15 to 19 are schematic diagrams showing the structures of other capacitors according to the fourth preferred embodiment.

FIGS. 21 to 27 are schematic diagrams showing the structures of other capacitors according to the fifth preferred embodiment.

FIG. 28 is a schematic diagram showing the structure of a capacitor according to a sixth preferred embodiment of the present invention.

DESCRIPTION OF THE PREFERRED EMBODIMENTS

Many of semiconductor devices adopt a line and space structure wherein a plurality of wires extending in a predetermined direction are aligned at predetermined intervals. As the semiconductor manufacturing technology progresses, the width of wires (line width) and the space between adjacent wires (space width) have decreased, but the thickness of wires has not been reduced so much. The capacitance formed between adjacent wires is thus relatively high and has not been utilized actively.

The present invention adopts metal wires as wires in the line and space structure to utilize the capacitance between adjacent metal wires, thereby achieving a small-sized capacitor having low parasitic resistance. The following preferred embodiments give the details of the present invention.

First Preferred Embodiment

Figure 2:
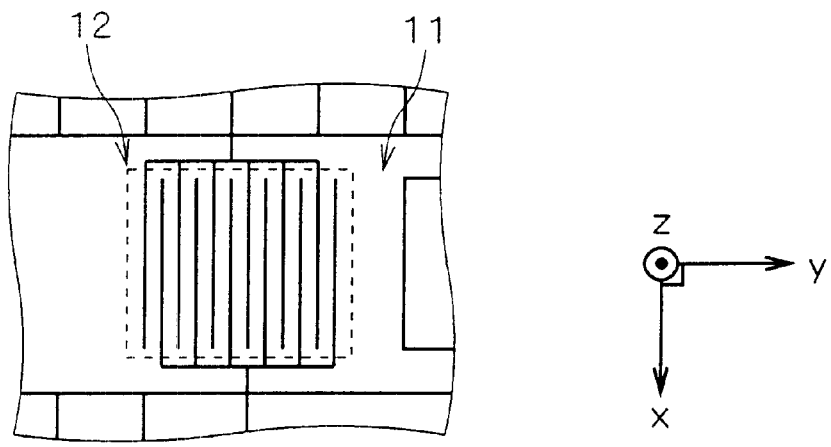
FIG. 2 is a top view showing the structure of a semiconductor device.

FIG. 1 is a perspective view showing the structure of a capacitor according to a first preferred embodiment of the present invention. The top view of FIG. 2 shows that a semiconductor device has a wiring portion 11 in which desired wires are formed and a capacitor portion 12 in which a capacitor is formed. The capacitor in FIG. 1 is formed in the capacitor portion 12 of the semiconductor device.

Referring now to FIG. 1, a plurality of wires 3 which are composed of metals such as Al and Cu and extend in the direction x, are aligned at predetermined intervals in the direction y, forming a line and space structure 4. The line and space structure 4 is formed on a silicon substrate 1. Further, an insulation film 2 composed for example of a silicon oxide film is formed on the silicon substrate 1 to provide electrical isolation between adjacent wires 3.

Figure 3:
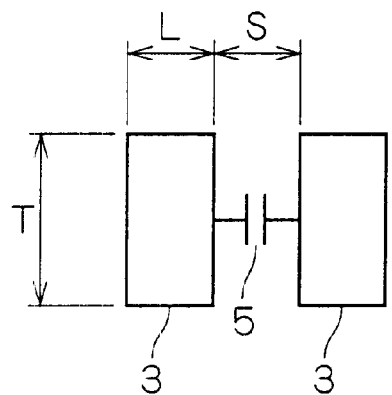
FIG. 3 is a schematic diagram of a pair of adjacent wires in the structure of FIG. 1, which is viewed from the direction x.

FIG. 3 is a schematic diagram of a pair of adjacent wires 3 in the structure of FIG. 1, which is viewed from the direction x. The width L of the wires 3 and the space S between the wires 3 are governed by the performance of the semiconductor manufacturing techniques (especially exposure technique) in forming the line and space structure. They are for example 0.2 $\mu$m. The thickness T of the wires 3 is about 0.5 $\mu$m. In FIG. 3, a high potential V1 is applied to one of the wires 3 and a low potential V2 is applied to the other, whereby a capacitance 5 is formed between the wires.

Figure 5:
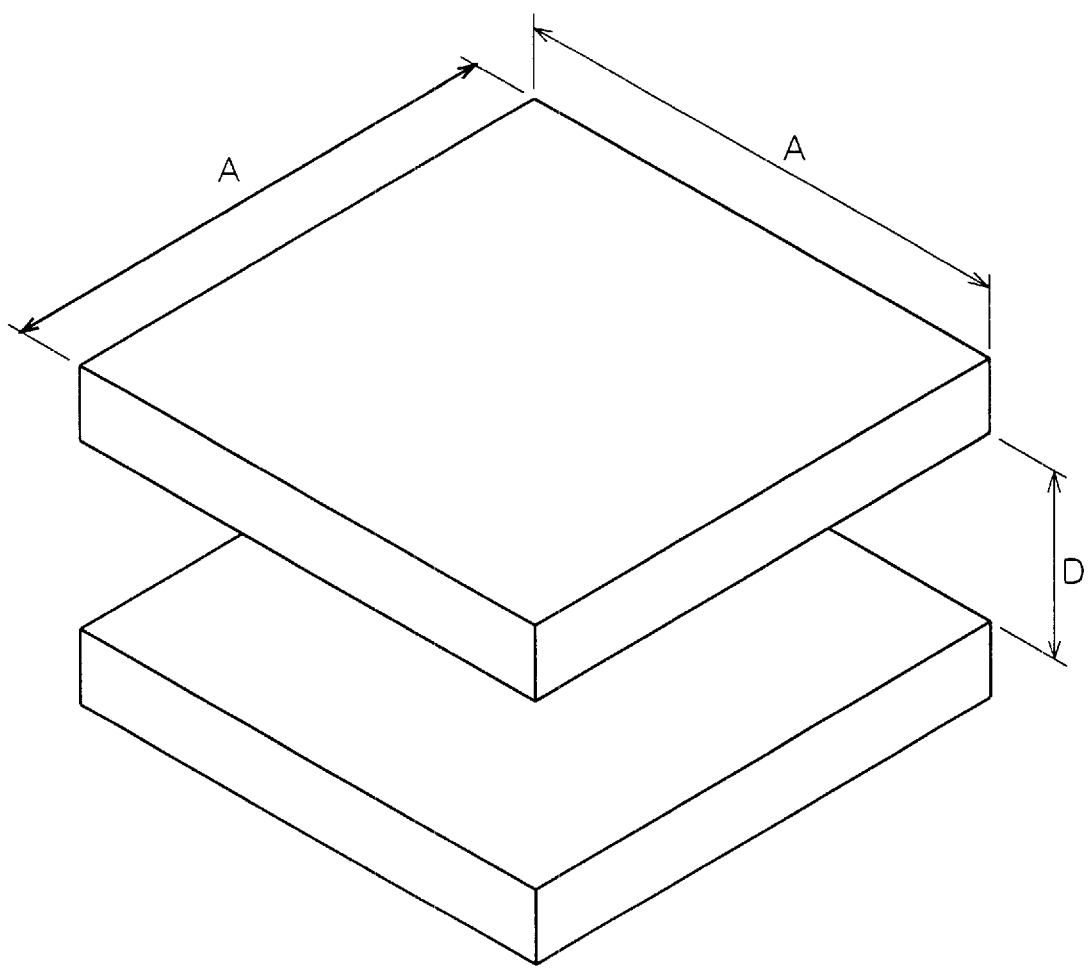
FIG. 5 is a perspective view schematically showing a pair of flat electrodes.

Now, we will compare the capacitances of a capacitor incorporating the line and space structure and a capacitor incorporating a pair of flat electrodes. FIG. 4 is a perspective view schematically showing a line and space structure, and FIG. 5 is a perspective view schematically showing a pair of flat electrodes. In FIGS. 4 and 5, a capacitance per unit square (A×A) is obtained.

A capacitance $C_1$ for the line and space structure is expressed by:

$$C_1 = K_0 \varepsilon_0 \frac{T \times A}{S} \times \frac{A}{2S} \quad (1)$$
$$= K_0 \varepsilon_0 \frac{TA^2}{2S^2}$$

When the insulation film is an oxide film, $K_0=3.9$, $\varepsilon_0 = 8.86 \times 10^{-14}$ F/cm.

A capacitance $C_2$ for the pair of flat electrodes, on the other hand, is expressed by:

$$C_2 = \varepsilon_0 K_0 \frac{A^2}{D} \quad (2)$$

With the assumption that D=5L=5S in FIGS. 4 and 5, the capacitance $C_2$ is expressed by:

$$C_2 = K_0 \varepsilon_0 \frac{A^2}{5S} \quad (3)$$

Figure 6:
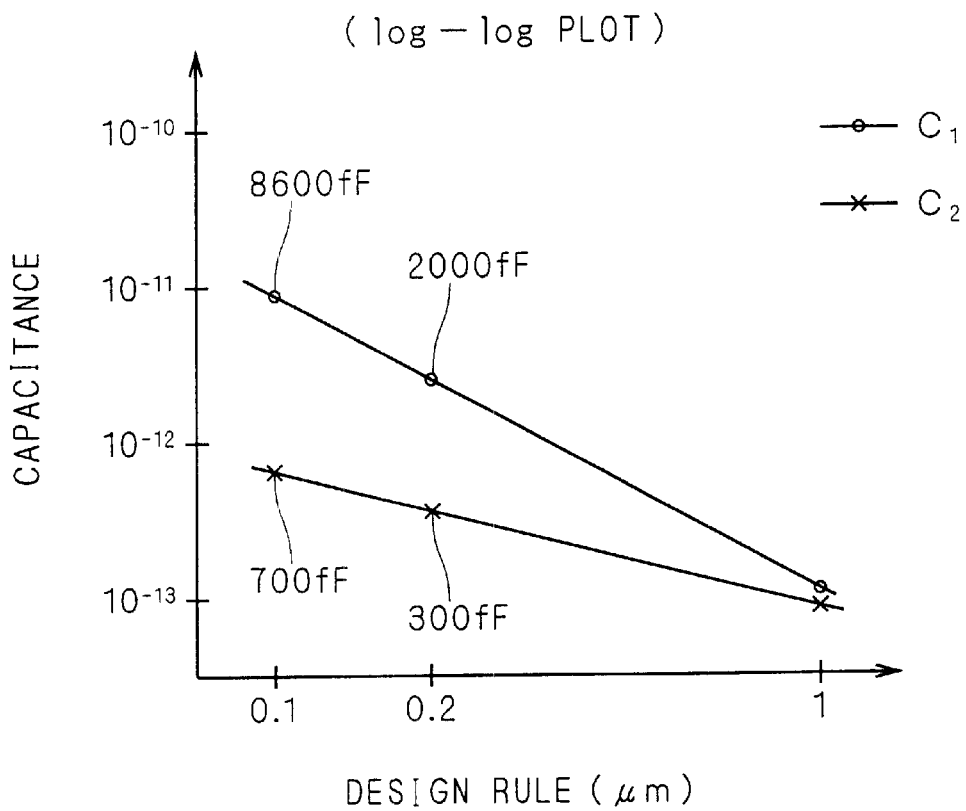
FIG. 6 is a plot of capacitances $C_1$, $C_2$ versus design rules.

When T=0.5 $\mu$m and A=100 $\mu$m in these equations, a plot of the capacitances $C_1$, $C_2$ versus design rules (=L, S) that range from 0.1 to 1 $\mu$m is shown in FIG. 6. It can be seen from FIG. 6 that the capacitances $C_1$ $C_2$ are roughly equal for 1$\mu$m design rules, and that the capacitance $C_1$, is about one order of magnitude larger than the capacitance $C_2$ for 0.2-$\mu$m or less design rules. That is, the smaller the design rules, the higher is the capacitance of the capacitor with the line and space structure than the capacitor with the flat electrodes.

Figure 7:
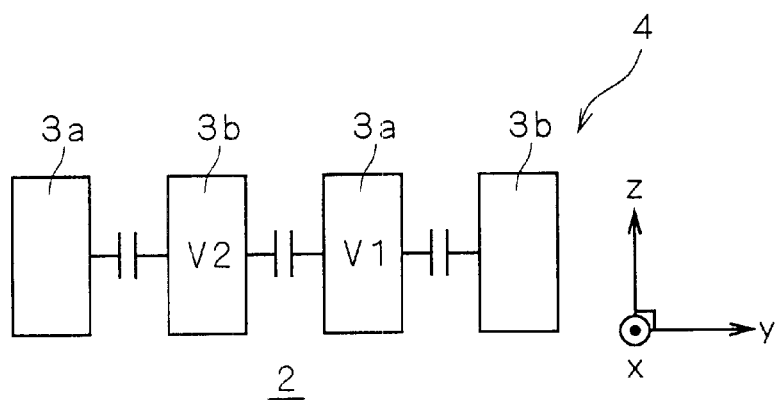
FIG. 7 is a schematic diagram of four successive wires in the structure of FIG. 1, which is viewed from the direction x.

FIG. 7 is a schematic diagram of four successive wires 3 in the structure of FIG. 1, which is viewed from the direction x. As shown, wires 3a serving as one electrode of the capacitor, to which the high potential V1 is applied, and wires 3b serving as the other electrode of the capacitor, to which the low potential V2 is applied, are alternately aligned, whereby a high-capacitance capacitor is easily obtained.

In this fashion, the capacitor of the first preferred embodiment adopts metal wires of low resistance as wires in the line and space structure to utilize the capacitance between adjacent metal wires. Accordingly, a small-sized high-capacitance capacitor having low parasitic resistance and low power losses is obtained.

The line and space structure is readily formable by using the known semiconductor manufacturing techniques such as exposure and etching. Thus, the capacitor can be formed with no additional processes and cost.

Although a plurality of equally spaced wires 3 form a line and space structure 4 in FIG. 1, the wires 3 do not have to be equally spaced as long as capacitance is provided between adjacent wires 3.

Second Preferred Embodiment

Figure 8:
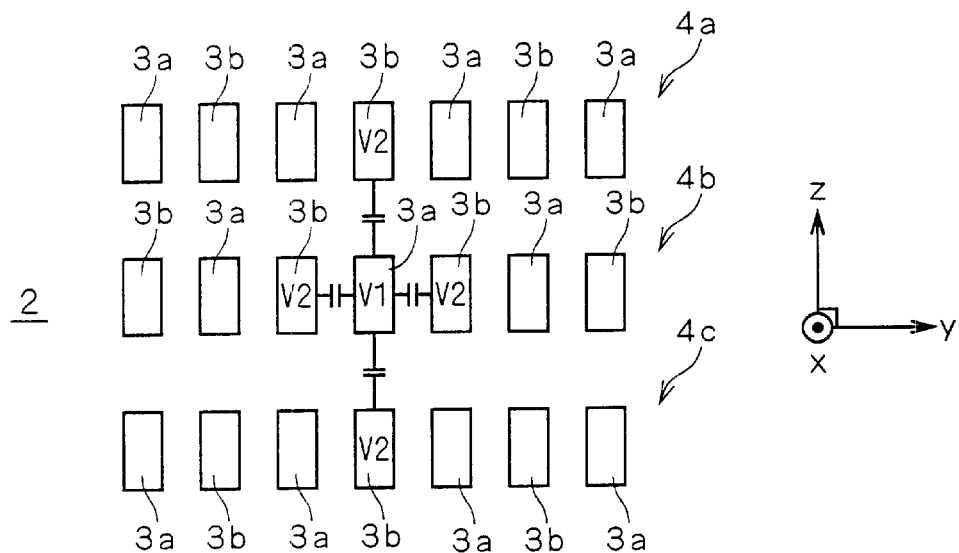
FIG. 8 is a schematic diagram showing the structure of a capacitor according to a second preferred embodiment of the present invention.

FIG. 8 is a schematic diagram showing the structure of a capacitor according to a second preferred embodiment of the present invention. Based on the capacitor of the first preferred embodiment, the capacitor of the second preferred embodiment has three line and space structures 4a to 4c which are identical to that in FIG. 7. The line and space structures 4a to 4c are stacked in layers with the insulation film 2 interposed therebetween so that the wires 3a and the wires 3b in the different structures are aligned alternately in the direction z.

While FIG. 8 shows the three line and space structures 4a to 4c, four or more line and space structures may be stacked in layers.

Each wire 3 in the lowest line and space structure may be a gate electrode of polysilicon formed on the semiconductor substrate 1. This is because low resistance can be achieved by composing the wires 3 in the other line and space structures of metals. In this case, the surface of the gate electrodes should be silicided or a metal layer should be formed on the gate electrodes, thereby to reduce the resistance of the gate electrodes themselves. The same can be said of the following third to sixth preferred embodiments.

In this fashion, according to the capacitor of the second preferred embodiment, each of wires 3a, 3b forms capacitances between four adjacent wires 3b, 3a aligned vertically and horizontally. This allows a further increase in capacity, for example, about twice as much as that of the capacitor according to the first preferred embodiment.

The wires 3 in the middle line and space structure are surrounded from above and below and from right and left by other wires 3, so they resist being disturbed. Accordingly, the capacitor resists being disturbed.

Third Preferred Embodiment

Figure 9:
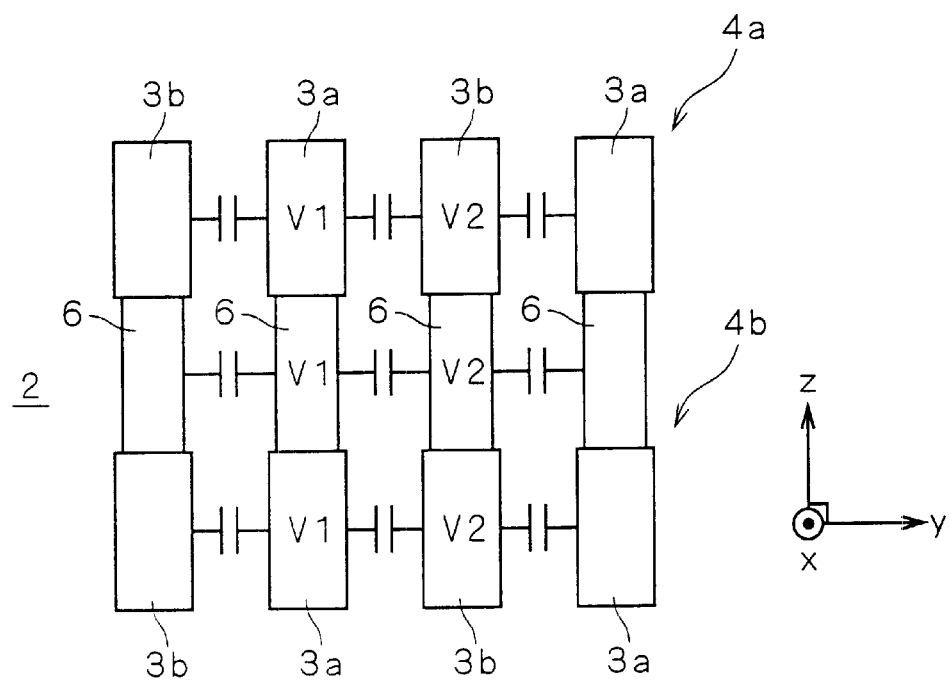
FIG. 9 is a schematic diagram showing the structure of a capacitor according to a third preferred embodiment of the present invention.

FIG. 9 is a schematic diagram showing the structure of a capacitor according to a third preferred embodiment of the present invention. Based on the capacitor of the first preferred embodiment, the capacitor of the third preferred embodiment has two line and space structures 4a, 4b which are identical to that in FIG. 7. The line and space structures 4a, 4b are stacked in layers with the insulation film 2 interposed therebetween so that the wires 3a in the different structures are aligned and the wires 3b in the different structures are aligned in the direction z. The wires 3a, 3b aligned in the direction z are electrically connected to each other by through holes 6 which are formed in the insulation film 2 and filled with metals such as W. While FIG. 9 shows the two line and space structures 4a, 4b, three or more line and space structures may be stacked in layers.

Figure 10:
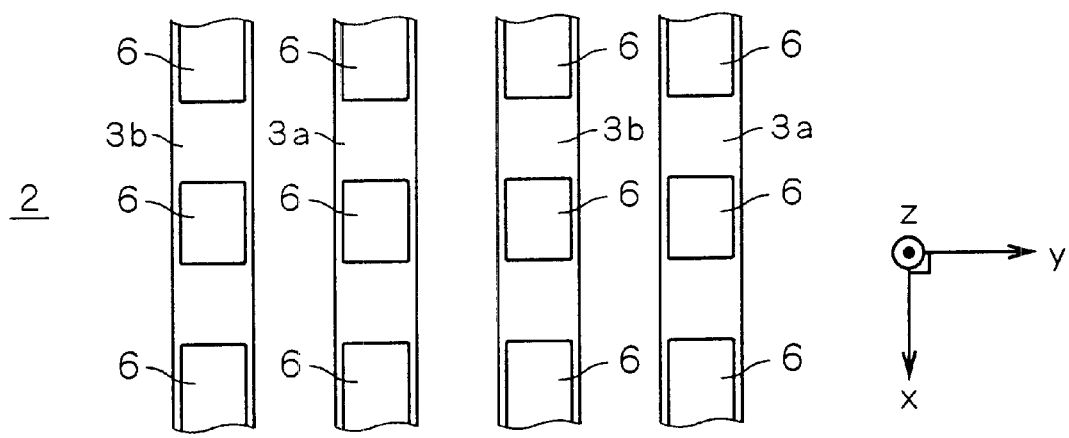
FIGS. 10 and 11 are schematic diagrams of through holes viewed from the direction z.
Figure 11:
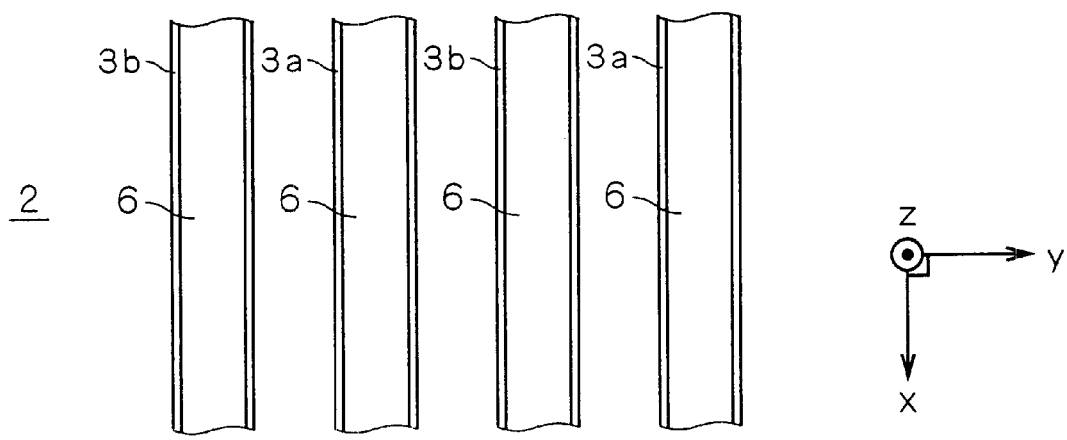

FIGS. 10 and 11 are schematic diagrams of the through holes 6 viewed from the direction z. As the through hole 6, a plurality of holes may be aligned as shown in FIG. 10 or a strip of hole may be overlaid on the wire 3a, 3b as shown in FIG. 11.

In this fashion, the capacitor of the third preferred embodiment forms capacitances even between adjacent through holes 6 as shown in FIG. 9. This allows a further increase in capacity. Here it is noted that the larger effect is obtained when the through holes 6 is formed in the form of a strip as shown in FIG. 11.

Fourth Preferred Embodiment

Figure 12:
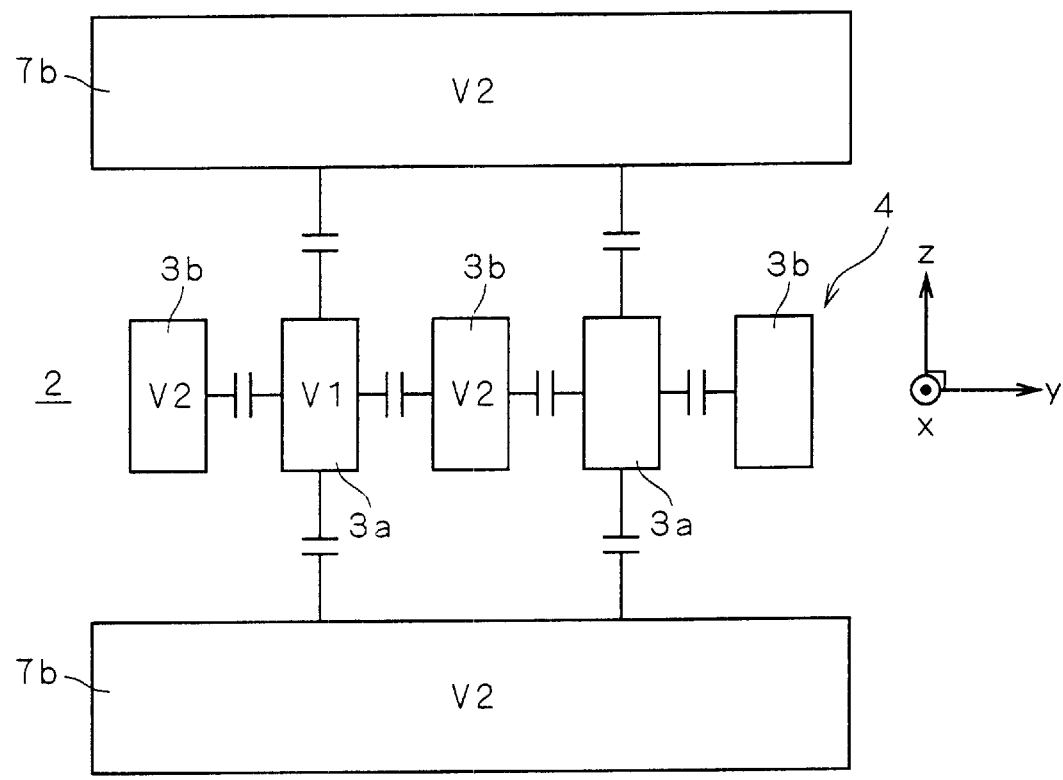
FIG. 12 is a schematic diagram showing the structure of a capacitor according to a fourth preferred embodiment of the present invention.

FIG. 12 is a schematic diagram showing the structure of a capacitor according to a fourth preferred embodiment of the present invention. The capacitor of the fourth preferred embodiment is based on the capacitor of the first preferred embodiment in FIG. 7. Flat electrodes 7b which is parallel to a plane defined by the directions x and y and to which the low potential V2 is applied are formed on the upper and lower sides of the line and space structure 4 with the insulation film 2 interposed therebetween so that they are aligned with the line and space structure 4 in the direction z. The flat electrodes 7b composed of metals or polysilicon are formed only in the capacitor portion 12 in FIG. 2.

The capacitor of the fourth preferred embodiment forms capacitances even between the wires 3a and the flat electrodes 7b. This allows a further increase in capacity.

Figure 13:
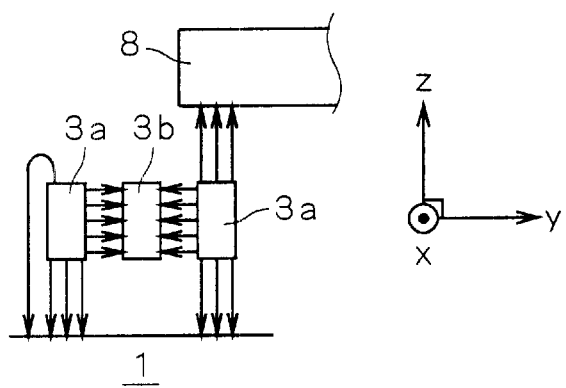
FIGS. 13 and 14 are schematic diagrams to explain the effects of the capacitor of the fourth preferred embodiment.
Figure 14:
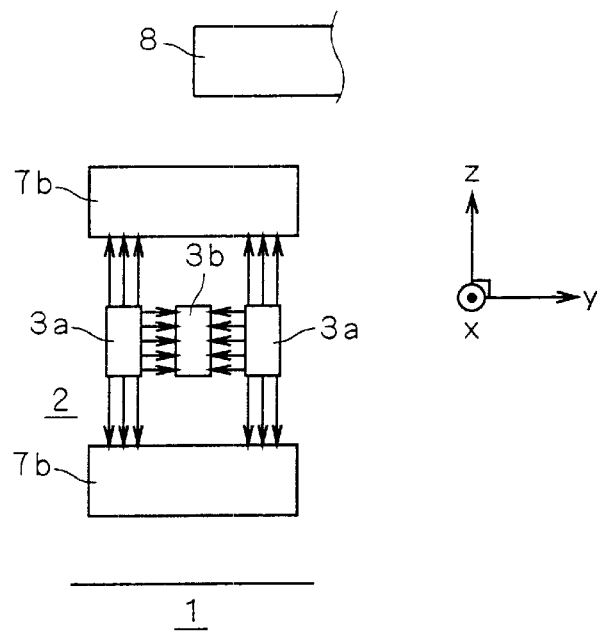

In structures with no flat electrodes 7b, the electric lines of force drawn from the wires 3a terminate not only at the wires 3b but also at the semiconductor substrate 1 and other signal lines 8 as shown in FIG. 13, thereby causing power losses. In the capacitor of the fourth preferred embodiment, on the other hand, all the electric lines from the wires 3a terminate at the wires 3b or the flat electrodes 7b as shown in FIG. 14. This prevents power losses and allows the formation of a desirable capacitor with no parasitic components. The presence of the flat electrodes 7b further reduces interference between the wires 3a and the other signal lines 8.

Figure 15:
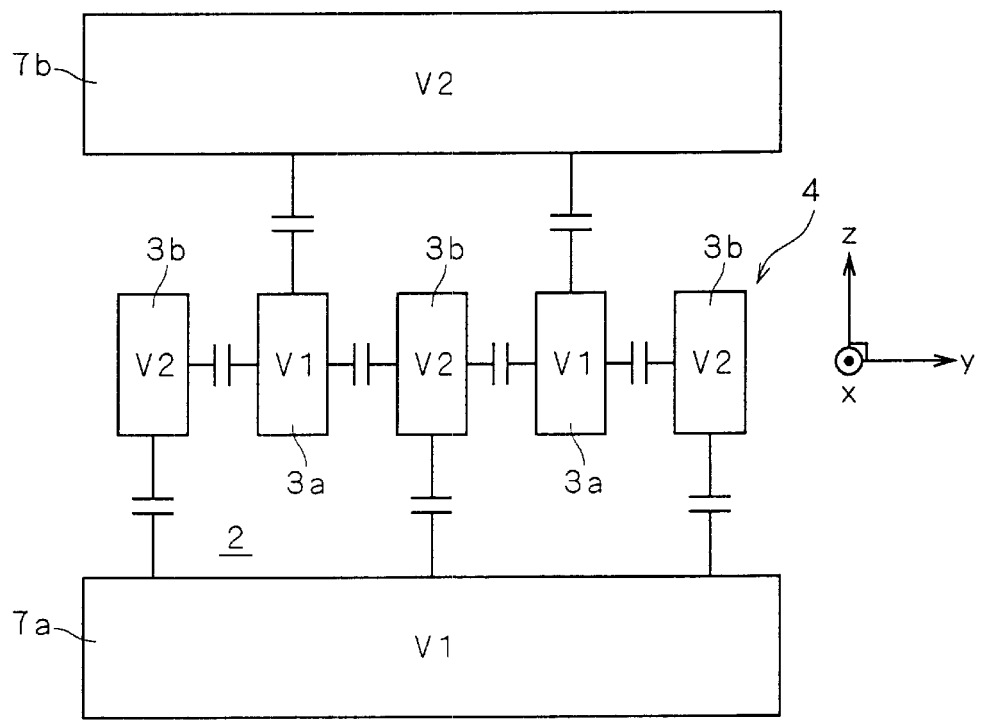
Figure 16:
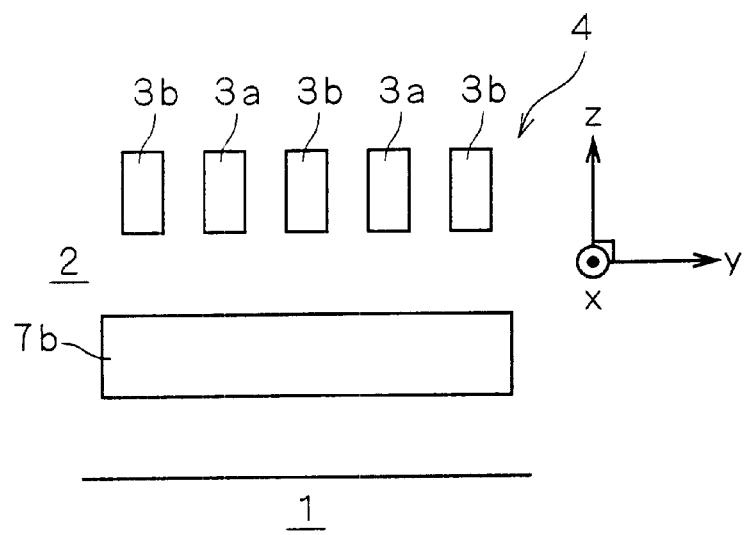

FIGS. 15 to 19 are schematic diagrams showing the structures of other capacitors according to the fourth preferred embodiment. While the flat electrodes 7b to which the low potential V2 is applied are arranged on the upper and lower sides of the line and space structure 4 in the capacitor of FIG. 12, either or both of the flat electrodes 7b may be a flat electrode 7a to which the high potential V1 is applied (FIG. 15).

Figure 17:
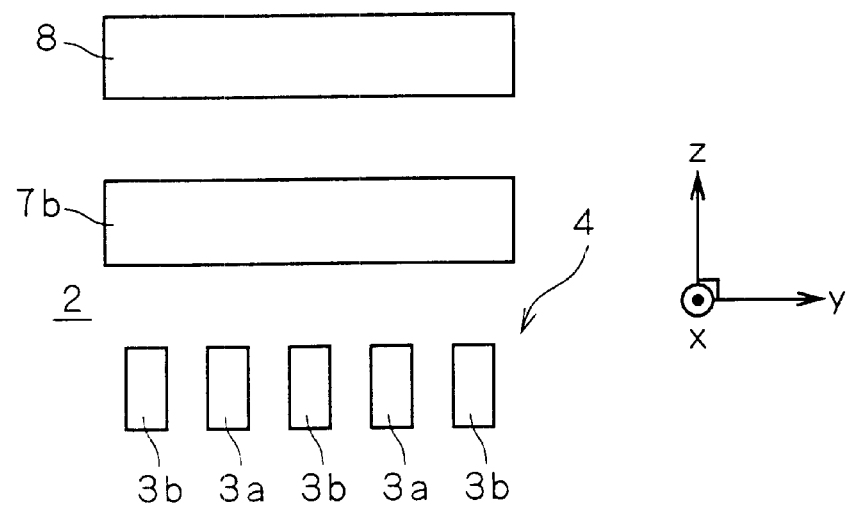

Instead of being arranged on both the upper and lower sides of the line and space structure 4 as shown in FIG. 12, the flat electrode may be arranged on either side of the structure. For example, the flat electrode 7b may be arranged only between the line and space structure 4 and the semiconductor substrate 1 (FIG. 16) or only between the line and space structure 4 and the other signal line 8 (FIG. 17).

While the capacitor of the fourth preferred embodiment in FIG. 12 is based on the capacitor of the first preferred embodiment in FIG. 7, it may be based on the capacitor of the second preferred embodiment in FIG. 8 (FIG. 18) or the capacitor of the third preferred embodiment in FIG. 9 (FIG. 19).

Fifth Preferred Embodiment

Figure 20:
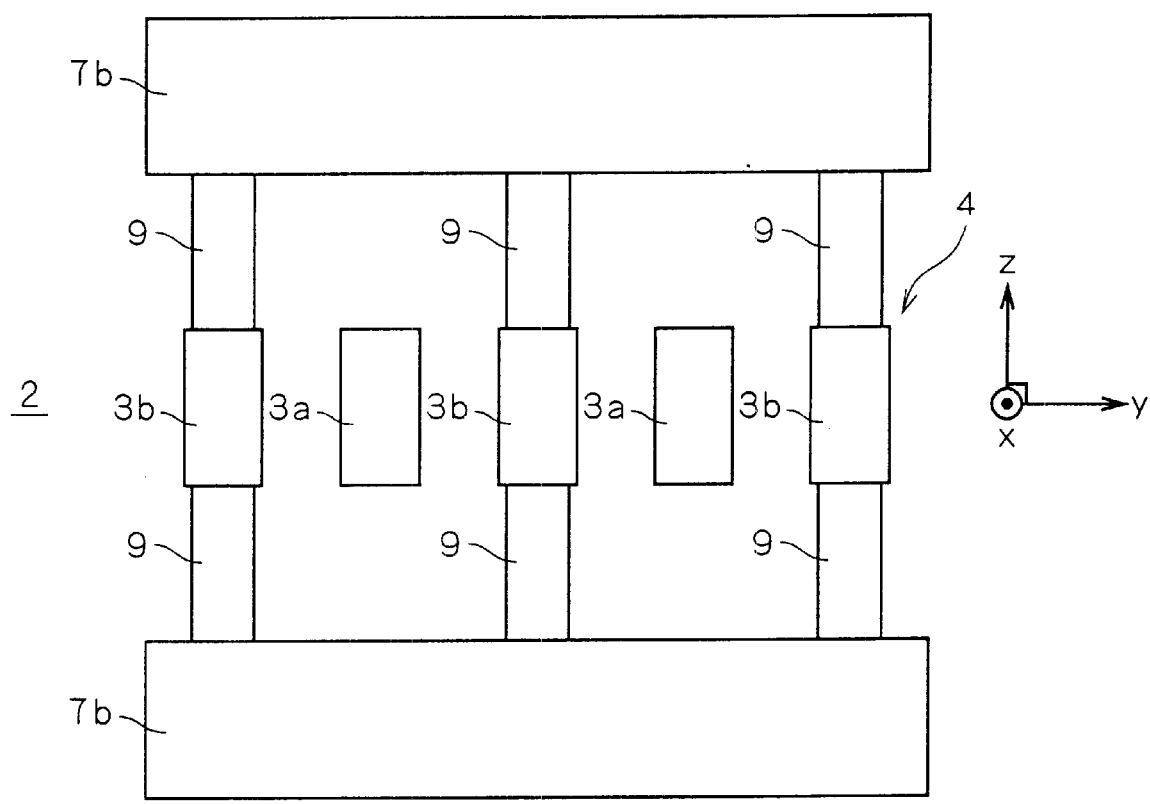
FIG. 20 is a schematic diagram showing the structure of a capacitor according to a fifth preferred embodiment of the present invention.

FIG. 20 is a schematic diagram showing the structure of a capacitor according to a fifth preferred embodiment of the present invention. The capacitor of the fifth preferred embodiment is based on the capacitor of the fourth preferred embodiment in FIG. 12. The wires 3b and the flat electrodes 7b, to which the same low potential V2 is applied, are electrically connected to each other by through holes 9 which are formed in the insulation film 2 and filled with metals such as W. The through holes 9 may be either of the ones shown in FIGS. 10 and 11.

In the capacitor of the fifth preferred embodiment, the wires 3a which are at the high potential V1 are surrounded by the wires 3b, the flat electrodes 7b, and the through holes 9 which are all at the low potential V2. This effectively reduces interference between the wires 3a and the semiconductor substrate 1 or the other signal lines 8.

Further, additional capacitances formed between the wires 3a and the through holes 9 allow a further increase in capacity.

Figure 21:
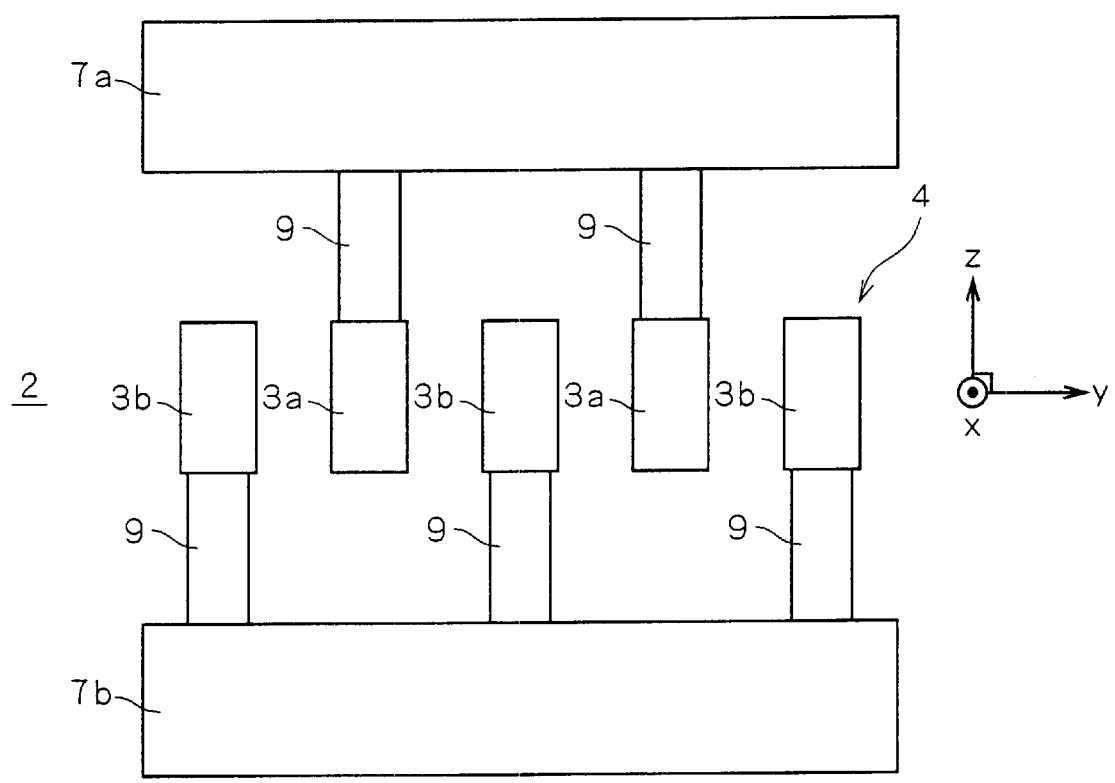

FIGS. 21 to 27 are schematic diagrams showing the structures of other capacitors according to the fifth preferred embodiment. In the capacitor of FIG. 20, the flat electrodes 7b to which the low potential V2 is applied are arranged on both the upper and lower sides of the line and space structure 4. Alternatively, either or both of the flat electrodes 7b may be substituted by the flat electrode(s) 7a to which the high potential V1 is applied, thereby to provide an electrical connection between the wires 3a and the flat electrode 7a through the through holes 9 (FIG. 21).

The capacitor in FIG. 20 has a single line and space structure 4, but the structure of FIG. 20 may be applied to each line and space structure of a capacitor which has a plurality of line and space structures 4a, 4b stacked in layers (FIG. 22).

Figure 23:
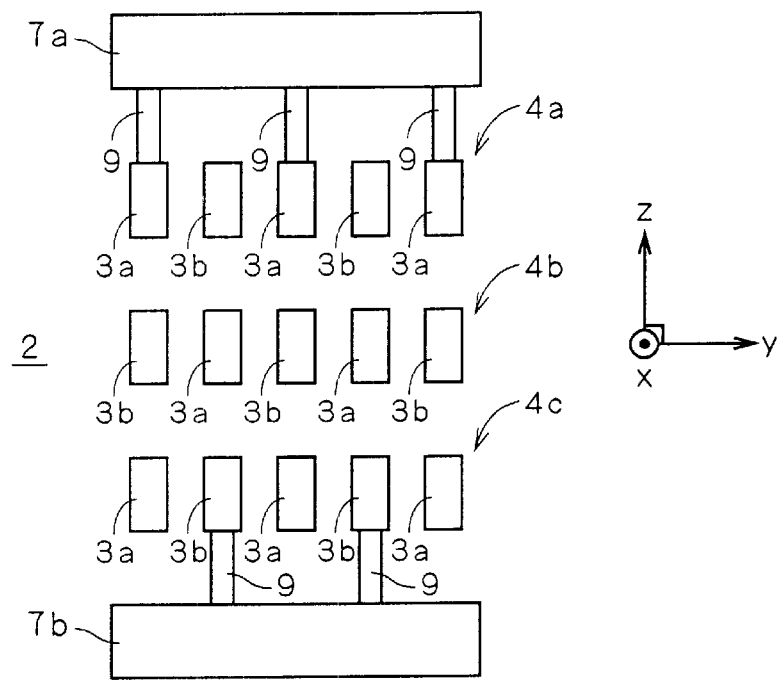
Figure 24:
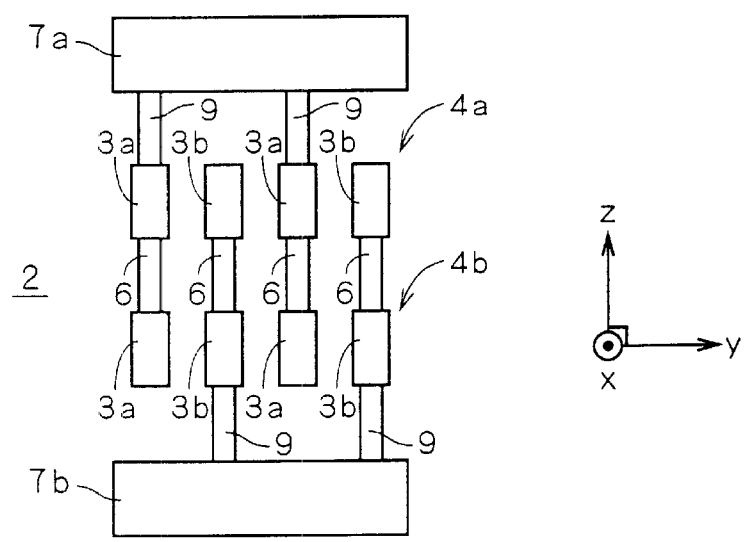

While the capacitor of the fifth preferred embodiment in FIG. 20 is based on the capacitor in FIG. 12, it may be based on the capacitor in FIG. 18, 19 (FIGS. 23, 24).

Figure 25:
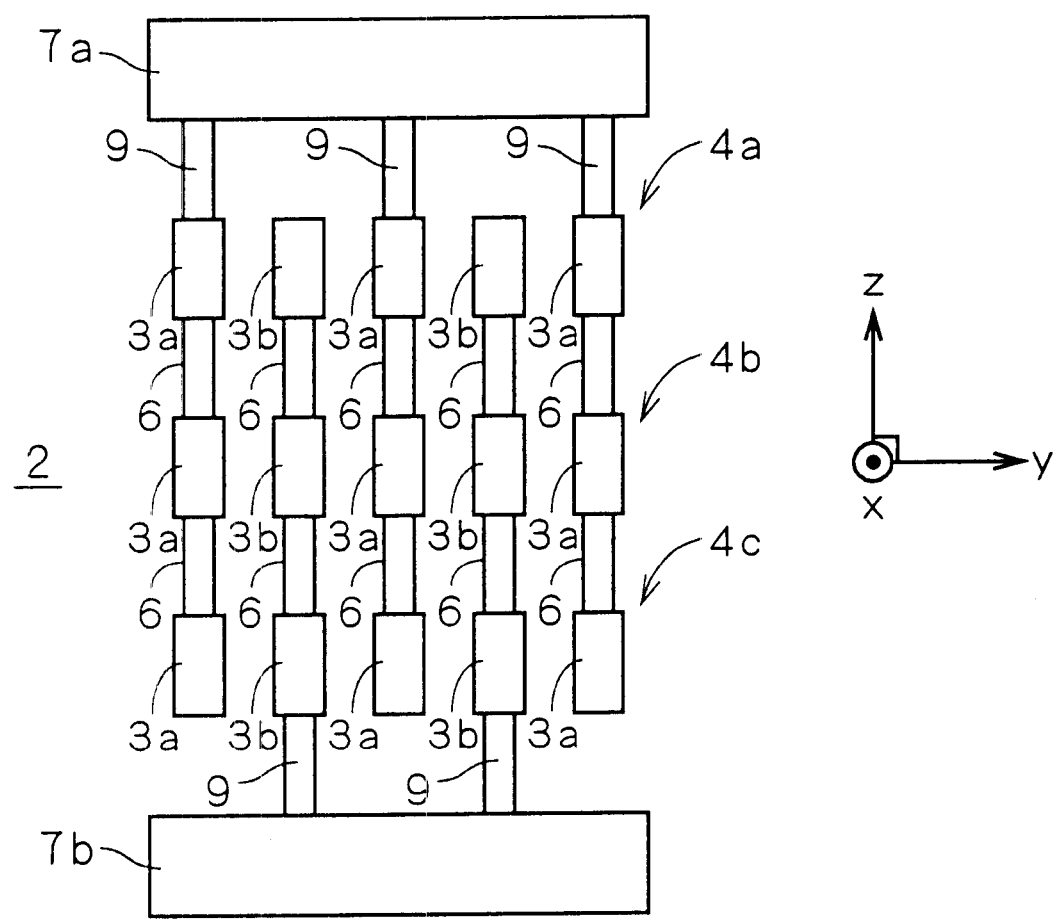

Instead of having two line and space structures 4a, 4b as shown in FIG. 24, the capacitor of the fifth preferred embodiment may have three, four, or five (or more) line and space structures (4a to 4e) as shown in FIGS. 25 to 27, respectively.

Sixth Preferred Embodiment

FIG. 28 is a schematic diagram showing the structure of a capacitor according to a sixth preferred embodiment of the present invention. The capacitor of the sixth preferred embodiment is based on the capacitor of the fifth preferred embodiment in FIG. 24. The flat electrodes 7b are provided on the upper and lower sides of the line and space structures 4a, 4b. Further, the flat electrodes 7a which is parallel to the flat electrodes 7b and to which the high potential V1 is applied are provided on the sides of the flat electrodes 7b opposite the line and space structures 4a, 4b, with the insulation film 2 interposed therebetween. The flat electrodes 7a are aligned with the line and space structures 4a, 4b in the direction z. The flat electrode 7a and the wires 3a are electrically connected to each other by through holes 10 which are formed in the insulation film 2 and filled with metals such as W. The through holes 10 may be either of the ones shown in FIGS. 10 and 11.

In the capacitor of the sixth preferred embodiment, the wires 3a and the through hole 6 arranged in the middle in FIG. 28 are surrounded by the wires 3b, the flat electrodes 7b, and the through holes 6, 9 which are all at the low potential V2. Further, the wires 3b, the flat electrodes 7b, and the through holes 6, 9 are surrounded by the wires 3a, the flat electrodes 7a, and the through holes 6, 10 which are all at the high potential V1. This effectively reduces interference between the wires 3a, 3b and the semiconductor substrate 1 or the other signal lines 8.

As opposed to the configuration of FIG. 28, the flat electrodes 7a may be provided on both the upper and lower sides of the line and space structures 4a, 4b and electrically connected to the wires 3a through the through holes 9 and the flat electrodes 7b may be provided on the sides of the flat electrodes 7a opposite the line and space structures 4a, 4b and electrically connected to the wires 3b through the through holes 10. In this case, the same effect as described above is obtained.

Seventh Preferred Embodiment

Figure 29:
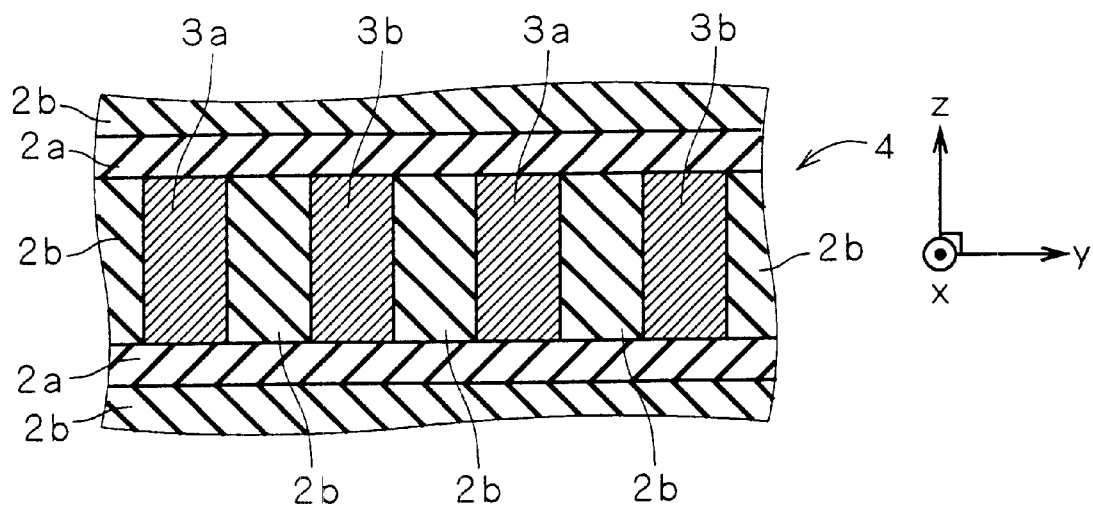
FIG. 29 is a cross-sectional view showing the structure of a capacitor according to a seventh preferred embodiment of the present invention.

FIG. 29 is a cross-sectional view showing the structure of a capacitor according to a seventh preferred embodiment of the present invention. In the capacitor in FIG. 29, highly dielectric films 2a which are composed for example of SiN or BST and have a higher dielectric constant than silicon oxide films are formed to a predetermined thickness in the planes on the upper and lower sides of the line and space structure 4. The line and space structure 4 comprises the wires 3a, 3b and silicon oxide films 2b.

Figure 30:
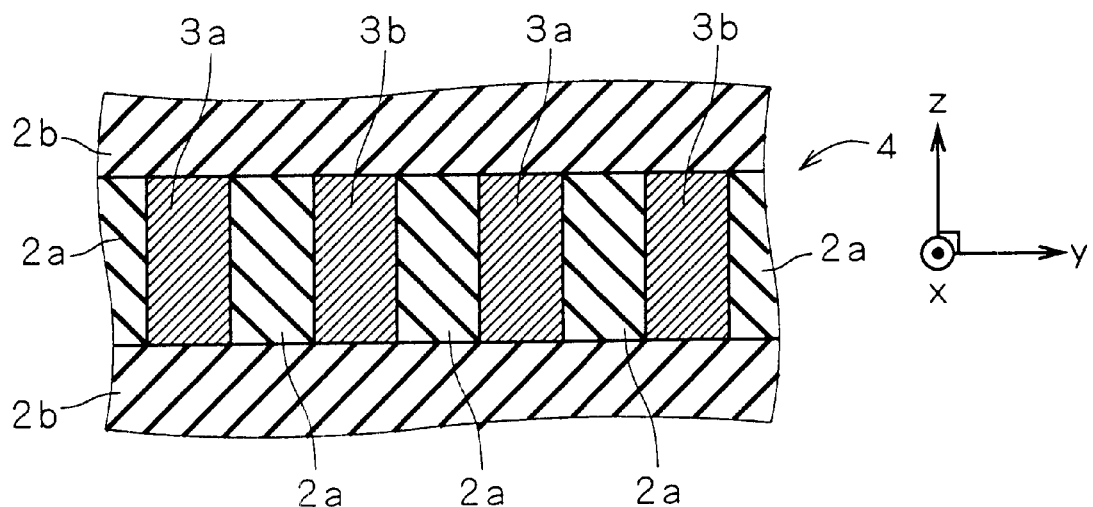
FIG. 30 is a cross-sectional view showing the structure of another capacitor according to the seventh preferred embodiment.

FIG. 30 is a cross-sectional view showing the structure of another capacitor according to the seventh preferred embodiment. The capacitor in FIG. 30 adopts the highly dielectric films 2a as the insulation films 2 between the wires 3a, 3b.

In the capacitor of the seventh preferred embodiment, the highly dielectric films 2a provided around the wires 3a, 3b allow an increase in capacity as compared with a capacitor comprising the insulation film 2 composed only of a silicon oxide film.

A combination of the highly dielectric films 2a in FIG. 29 and the same in FIG. 30 allow a further increase in capacity.

Eighth Preferred Embodiment

Figure 31:
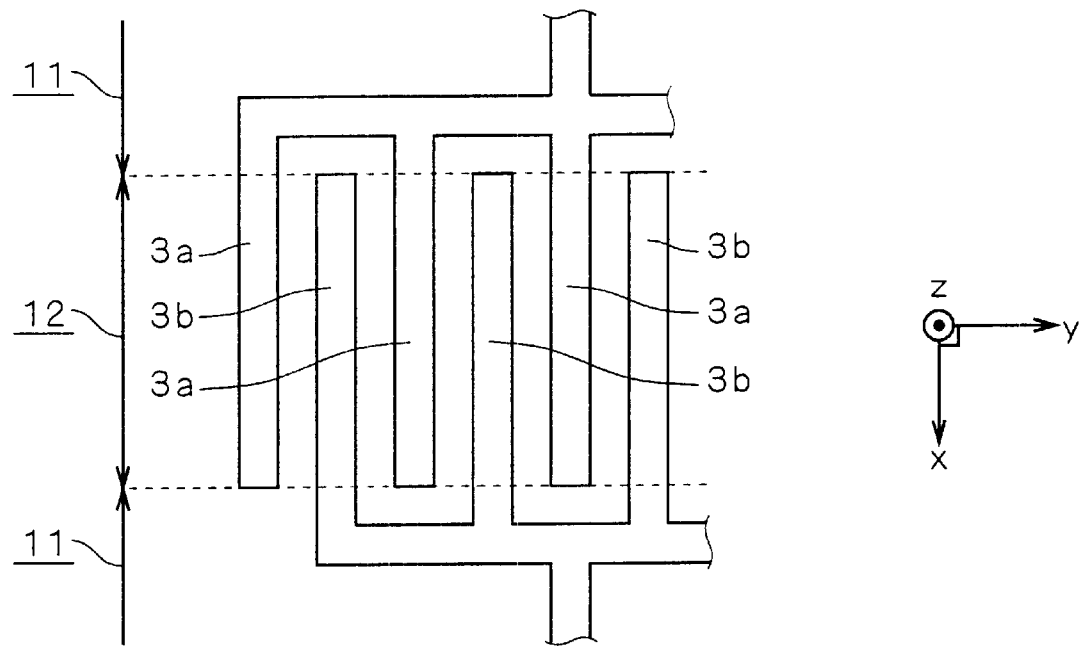
FIG. 31 is a schematic diagram of wires viewed from the direction z.
Figure 32:
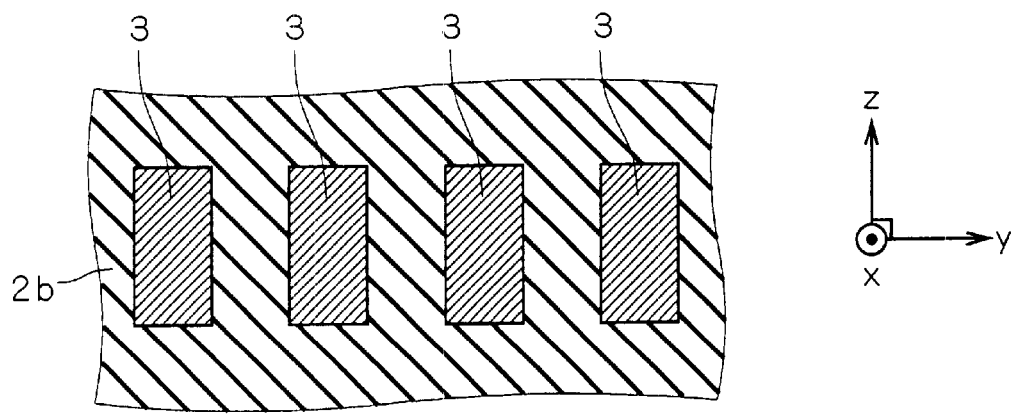
FIG. 32 is a cross-sectional view showing a section of a wiring portion.

FIG. 31 is a schematic diagram of a semiconductor device viewed from the direction z. This semiconductor device has a wiring portion 11 and a capacitor portion 12. The capacitor portion 12 adopts a structure wherein the highly dielectric films 2a are provided around the wires 3a, 3b as shown in FIGS. 29, 30. The wiring portion 11 adopts a structure wherein the insulation film 2 is composed only of the silicon oxide film 2b as shown in FIG. 32.

The capacitor of the eighth preferred embodiment achieves an increase in capacity in the capacitor portion 12 and low parasitic capacitances and high-speed operation in the wiring portion 11.

Figure 33:
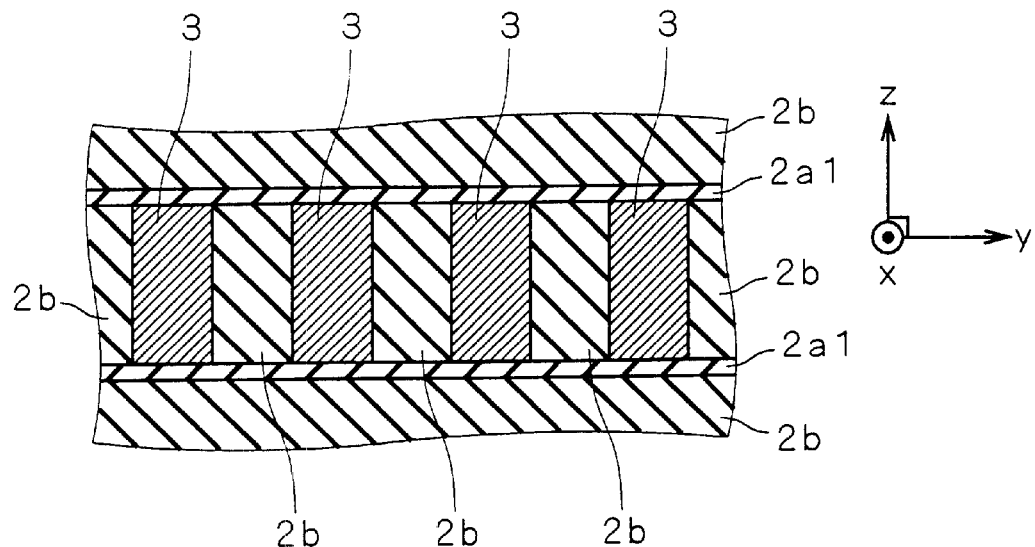
FIGS. 33 and 34 are cross-sectional views showing the structure of a capacitor according to a first modification of an eighth preferred embodiment of the present invention.
Figure 34:
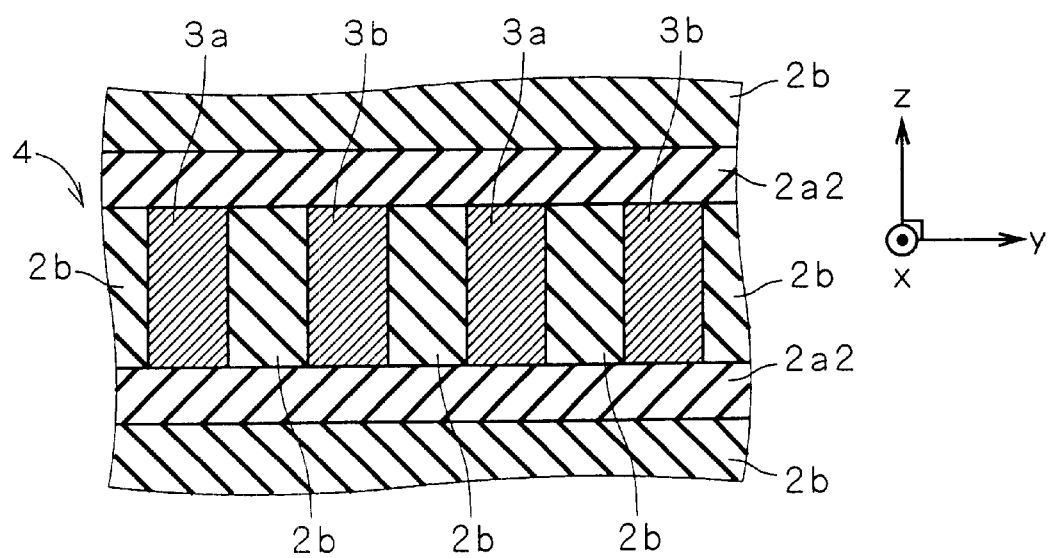

FIGS. 33 and 34 are cross-sectional views showing the structure of a capacitor according to a first modification of the eighth preferred embodiment. FIG. 33 shows a section of the wiring portion 11, and FIG. 34 shows a section of the capacitor portion 12. The highly dielectric films 2a are formed on the upper and lower sides of the line and space structure 4 so that highly dielectric films 2a1 in the wiring portion 11 are thin and highly dielectric films 2a2 in the capacitor portion 12 are thick. The difference in the thickness of the highly dielectric films 2a between the wiring portion 11 and the capacitor portion 12 achieves the same effect as described above.

Figure 35:
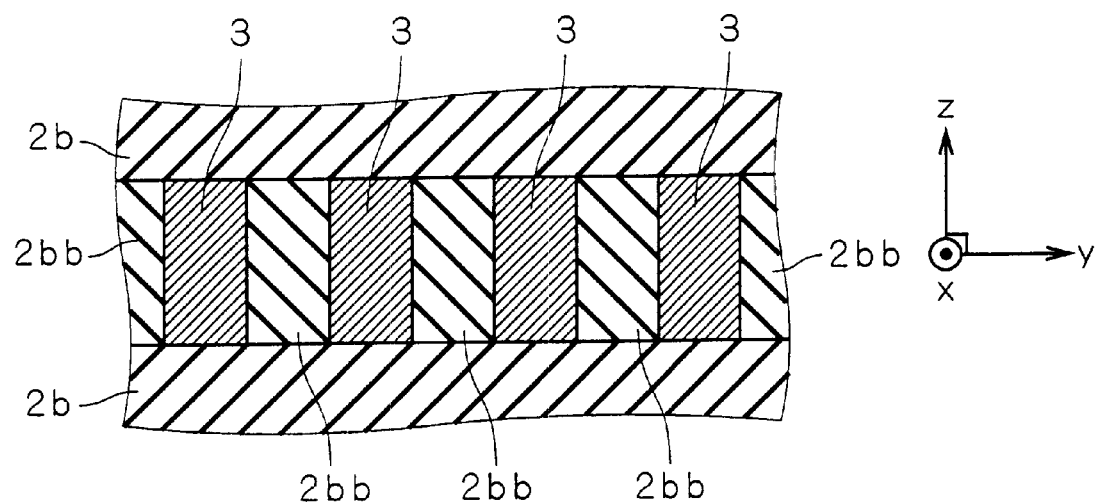
FIG. 35 is a cross-sectional view showing the structure of a capacitor according to a second modification of the eighth preferred embodiment.

FIG. 35 is a cross-sectional view showing the structure of a capacitor according a second modification of the eighth preferred embodiment, especially a section of the wiring portion 11. Impurities such as F for reducing the dielectric constant are introduced into the silicon oxide film 2b between adjacent wires 3, thereby to form a silicon oxide film 2bb. The introduction of impurities into the insulation film 2 is not done in the capacitor portion 12. This structure allows a further reduction in parasitic capacitance in the wiring portion 11, thereby achieving speeding up of operations.

Figure 36:
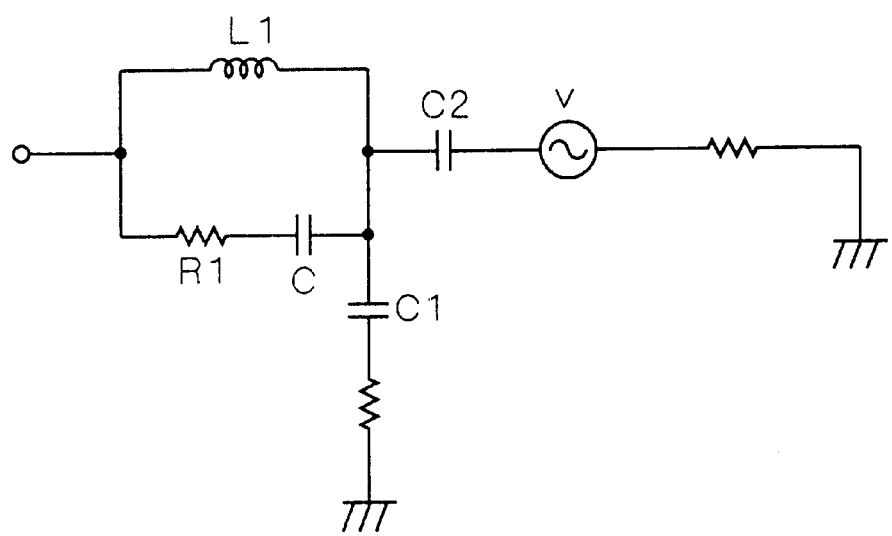
FIG. 36 is a circuit diagram of a known resonant circuit.
Figure 37:
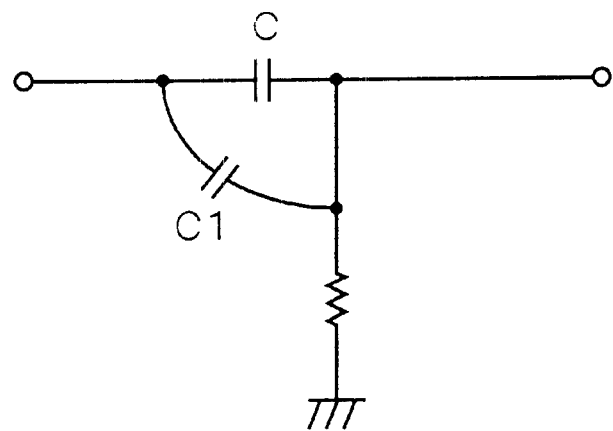
FIG. 37 is a circuit diagram of a known high-pass filter circuit.
Figure 38:
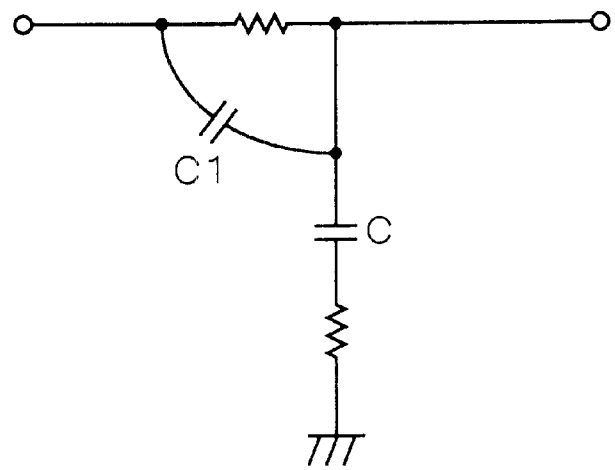
FIG. 38 is a circuit diagram of a known low-pass filter circuit.
Figure 39:
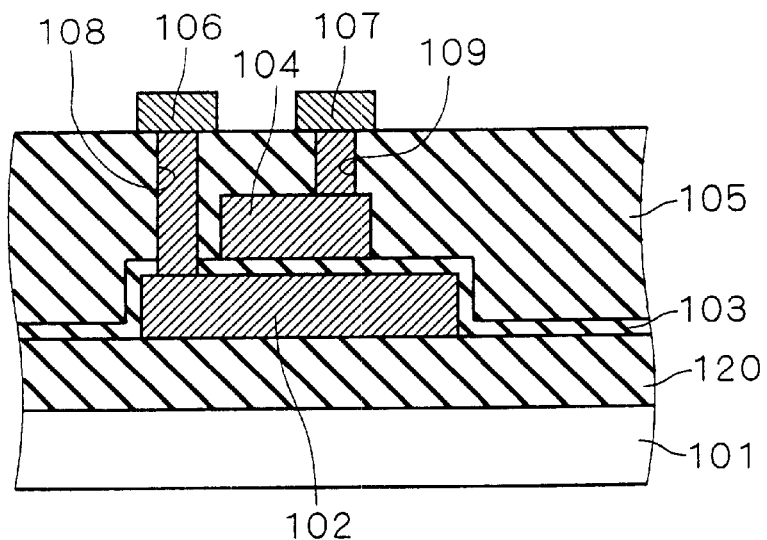
FIG. 39 is a cross-sectional view showing the structure of a conventional capacitor.
Figure 40:
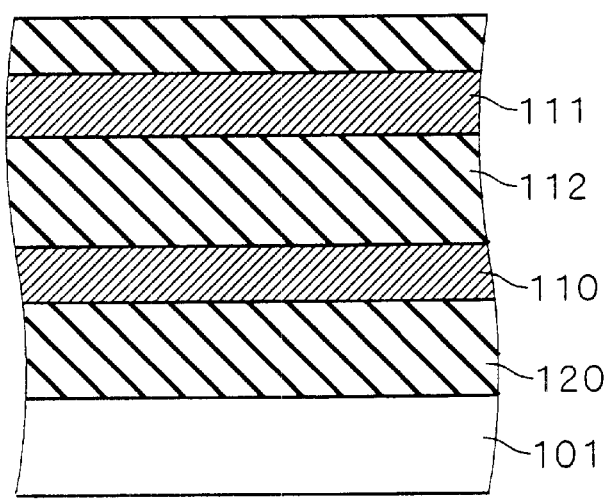
FIG. 40 is a cross-sectional view showing the structure of another conventional capacitor.
Figure 41:
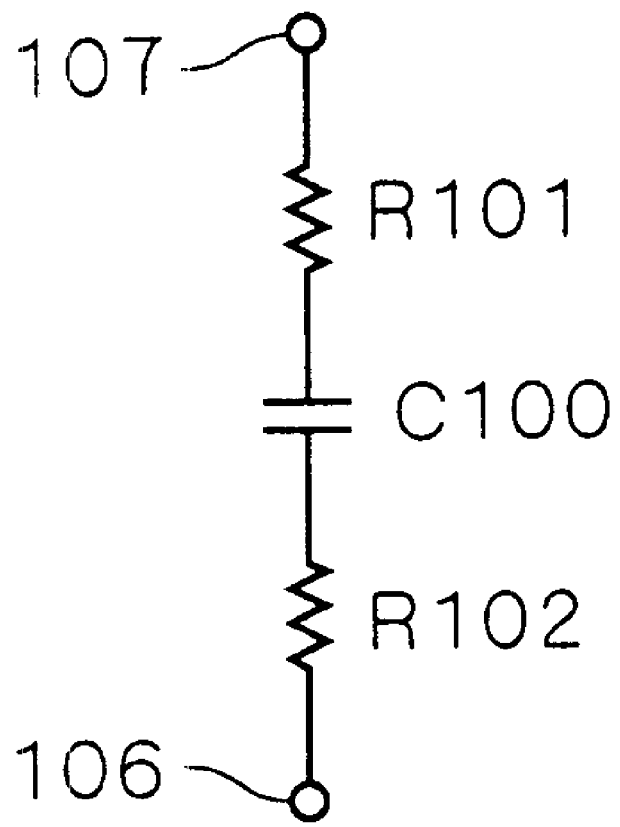
FIG. 41 is an equivalent circuit diagram of the capacitor in FIG. 39.

Now, we will describe the applications of the capacitors of the first to eighth preferred embodiments. FIGS. 36, 37, and 38 are circuit diagrams of a known resonant circuit, a known high-pass filter, and a known low-pass filter, respectively. In the drawings, C1 and C2 indicate the parasitic capacitances formed for example with a semiconductor substrate, and v indicates the voltage representing the influence of other signal lines. The use of the capacitors of the first to eighth preferred embodiments as the capacitances C in FIG. 36 achieves a high-performance low-loss resonant circuit which is less susceptible to interference by other circuits. Further, the capacitances C can be set with a high degree of precision, which allows a passing frequency band to be narrowed down with high accuracy when the capacitors are used in a band-pass filter. Furthermore, the use of the capacitors of the first to eighth preferred embodiments as the capacitances C in FIGS. 37, 38 achieves filter circuits with high cut-off capability.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

an underlying layer having a main surface; and a capacitor formed on said main surface of said underlying layer, said capacitor having at least one line and space structure in which a plurality of metal wires, each extending in a first direction of said main surface, are electrically isolated from each other by an insulation film and aligned in a second direction of said main surface, perpendicular to said first direction, wherein said capacitor further includes at least one flat plate electrode which is parallel to said main surface and aligned with said line and space structure in a third direction perpendicular to said main surface through a predetermined interlayer insulation film.

2. The semiconductor device according to claim 1, wherein said line and space structure includes a first wire serving as one electrode and a second wire serving as the other electrode, said first wire and said second wire being aligned alternately.

3. The semiconductor device according to claim 1, wherein said at least one flat electrode includes a plurality of flat electrodes which are arranged on both sides of said line and space structure in alignment with said line and space structure in said third direction.

4. The semiconductor device according to claim 1, wherein said capacitor further includes a through hole which is filled with a conductor and formed in said predetermined interlayer insulation film to provide an electrical connection between said first wire and said flat electrode.

5. The semiconductor device according to claim 2, wherein said at least one line and space structure includes three or more line and space structures, said three or more line and space structures being stacked in layers with an interlayer insulation film interposed therebetween so that said first wire and said second wire in different ones of said line and space structures are aligned alternately in a third direction perpendicular to said main surface.

6. The semiconductor device according to claim 5, wherein said at least one flat plate electrode includes a plurality of flat plate electrodes which are arranged on both sides of said line and space structures in alignment with said line and space structures in said third direction.

7. The semiconductor device according to claim 5, wherein said capacitor further includes a through hole which is filled with a conductor and formed in said predetermined interlayer insulation film to provide an electrical connection between said first wire and said flat plate electrode.

8. The semiconductor device according to claim 2, wherein said at least one line and space structure includes a plurality of line and space structures, said plurality of line and space structures being stacked in layers with an interlayer insulation film interposed therebetween so that said first wires in different ones of said line and space structures are aligned and said second wires in different ones of said line and space structures are aligned, in a third direction perpendicular to said main surface, and wherein said first wires and said second wires aligned in said third direction are electrically connected to each other by through holes which are filled with conductors and formed in said interlayer insulation film.

9. The semiconductor device according to claim 8, wherein said at least one flat plate electrode includes a plurality of flat plate electrodes which are arranged on both sides of said line and space structures in alignment with said line and space structures in said third direction.

10. The semiconductor device according to claim 8, wherein said capacitor further includes a through hole which is filled with a conductor and formed in said predetermined interlayer insulation film to provide an electrical connection between said first wire and said flat plate electrode.

11. The semiconductor device according to claim 8, wherein said capacitor further includes:

a first through hole which is filled with a conductor and formed in said predetermined interlayer insulation film to provide an electrical connection between said first wire and said flat plate electrode;

another flat plate electrode which is arranged outside said flat plate electrode through another interlayer insulation film in alignment with said line and space structures in said third direction on the same side as said flat plate electrode; and a second through hole which is filled with a conductor and formed in said another interlayer insulation film to provide an electrical connection between said second wire and said another flat plate electrode.

12. The semiconductor device according to claim 1, wherein said capacitor further includes:

an interlayer insulation film formed on said line and space structure; and a highly dielectric film which is formed in contact part between said interlayer insulation film and said line and space structure and has a higher dielectric constant than a silicon oxide film.

13. The semiconductor device according to claim 12, wherein
said semiconductor device has a wiring portion in which desired wires are formed and a capacitor portion in which said capacitor is formed; and
said highly dielectric film is provided only in said capacitor portion.

14. The semiconductor device according to claim 1, wherein
said insulation film is a highly dielectric film which has a higher dielectric constant than a silicon oxide film.

15. The semiconductor device according to claim 14, wherein
said semiconductor device has a wiring portion in which desired wires are formed and a capacitor portion in which said capacitor is formed; and
said highly dielectric film is provided only in said capacitor portion.

16. The semiconductor device according to claim 14, wherein
said semiconductor device has a wiring portion in which desired wires are formed and a capacitor portion in which said capacitor is formed; and
said insulation film in said wiring portion is a silicon oxide film doped with impurities for reducing the dielectric constant.

17. The semiconductor device according to claim 1, wherein
both line and space widths of said line and space structure are not more than 0.2 $\mu$m.

18. A semiconductor device comprising:
an underlying layer having a main surface; and
a capacitor formed on said main surface of said underlying layer,
said capacitor having at least one line and space structure in which a plurality of metal wires, each extending in a first direction of said main surface, are electrically isolated from each other by an insulation film and aligned in a second direction of said main surface, perpendicular to said first direction, wherein
said insulation film is a highly dielectric film which has a higher dielectric constant than a silicon oxide film,
said semiconductor device has a wiring portion in which desired wires are formed and a capacitor portion in which said capacitor is formed, and
said insulation film in said wiring portion is a silicon oxide film doped with impurities for reducing the dielectric constant.

19. A semiconductor device comprising:
an underlying layer having a main surface; and
a capacitor formed on said main surface of said underlying layer,
said capacitor having at least one line and space structure in which a plurality of metal wires, each extending in a first direction of said main surface, are electrically isolated from each other by an insulation film and aligned in a second direction of said main surface, perpendicular to said first direction, wherein both line and space widths of said line and space structure are not more than 0.2 $\mu$m.

* * * * *